United States Patent
Nagasawa

(10) Patent No.: US 10,495,935 B2
(45) Date of Patent: Dec. 3, 2019

(54) ELECTRO-OPTICAL DEVICE AND ELECTRONIC APPARATUS WITH SAMPLING AND MONITORING TRANSISTORS

(71) Applicant: SEIKO EPSON CORPORATION, Tokyo (JP)

(72) Inventor: Hitoya Nagasawa, Matsumoto (JP)

(73) Assignee: SEIKO EPSON CORPORATION, Tokyo (JP)

(*) Notice: Subject to any disclaimer, the term of this patent is extended or adjusted under 35 U.S.C. 154(b) by 0 days.

(21) Appl. No.: 16/002,318

(22) Filed: Jun. 7, 2018

(65) Prior Publication Data

US 2018/0373106 A1 Dec. 27, 2018

(30) Foreign Application Priority Data

Jun. 26, 2017 (JP) ................................. 2017-123992

(51) Int. Cl.
| | |
|---|---|
| *G02F 1/1362* | (2006.01) |
| *G02F 1/1335* | (2006.01) |
| *G02F 1/133* | (2006.01) |
| *G02F 1/1343* | (2006.01) |
| *G02F 1/1345* | (2006.01) |
| *H01L 29/786* | (2006.01) |
| *G02F 1/1368* | (2006.01) |
| *H01L 27/12* | (2006.01) |

(52) U.S. Cl.
CPC ...... *G02F 1/136286* (2013.01); *G02F 1/1343* (2013.01); *G02F 1/13306* (2013.01); *G02F 1/13454* (2013.01); *G02F 1/133512* (2013.01); *H01L 27/1222* (2013.01); *H01L 29/78633* (2013.01); *H01L 29/78675* (2013.01); *G02F 1/136209* (2013.01); *G02F 2001/13685* (2013.01); *G02F 2201/123* (2013.01)

(58) Field of Classification Search
None
See application file for complete search history.

(56) References Cited

U.S. PATENT DOCUMENTS

| | | | |
|---|---|---|---|
| 2003/0076459 A1 | 4/2003 | Murade | |
| 2004/0239610 A1* | 12/2004 | Ishii | G09G 3/3611 345/100 |

(Continued)

FOREIGN PATENT DOCUMENTS

| | | |
|---|---|---|
| JP | 2003-177376 A | 6/2003 |
| JP | 2003-177427 A | 6/2003 |

(Continued)

*Primary Examiner* — David D Davis
(74) *Attorney, Agent, or Firm* — Oliff PLC

(57) ABSTRACT

An electro-optical device (e.g., a liquid crystal device) includes a data line connected to a switching element provided for each pixel, a sampling transistor that has a gate supplied with a selection signal, a source supplied with an image signal, and a drain connected to the data line, and a monitoring transistor. A gate of the monitoring transistor is supplied with an input signal. A delay signal indicating a delay amount of the selection signal is sent out from a drain of the monitoring transistor. The sampling transistor includes a plurality of transistors connected in parallel to each other along the data line. The monitoring transistor includes one transistor along the data line.

9 Claims, 25 Drawing Sheets

(56) References Cited

U.S. PATENT DOCUMENTS

| | | | |
|---|---|---|---|
| 2005/0068310 A1* | 3/2005 | Ishii | G09G 3/3688 |
| | | | 345/204 |
| 2006/0152665 A1 | 7/2006 | Murade | |
| 2007/0206147 A1 | 9/2007 | Murade | |
| 2008/0198314 A1 | 8/2008 | Murade | |
| 2009/0033819 A1 | 2/2009 | Nakagawa | |

FOREIGN PATENT DOCUMENTS

| JP | 2003-177428 A | 6/2003 |
|---|---|---|
| JP | 2004-361919 A | 12/2004 |
| JP | 2005-141264 A | 6/2005 |
| JP | 2009-053660 A | 3/2009 |
| JP | 2010-139535 A | 6/2010 |
| JP | 2017-120295 A | 7/2017 |

* cited by examiner

ELECTRO-OPTICAL DEVICE AND ELECTRONIC APPARATUS WITH SAMPLING AND MONITORING TRANSISTORS

BACKGROUND

1. Technical Field

The present invention relates to an electro-optical device and an electronic apparatus including the electro-optical device.

2. Related Art

There is disclosed an active matrix type liquid crystal display device as an electro-optical device, including a sample and hold circuit for supplying a plurality of phase-developed image signals to sequentially selected data lines, and a precharge circuit that supplies image auxiliary input signals to the data lines before the application of image signals by the sample and hold circuit during one horizontal retrace period (JP-A-2003-177376).

In the active matrix type liquid crystal display device of JP-A-2003-177376, in signal transmission paths for transmitting signals from a plurality of image signal lines to a desired sample and hold circuit through relay wirings, the relay wirings made of a conductive film having a higher resistance than the image signal lines, are formed to have the same width and length as one another. Therefore, by making a time constant in the signal transmission paths constant, it is possible to suppress display unevenness due to a variation in the time constant.

Transistors constituting the sample and hold circuit have a larger channel width of a semiconductor layer than other transistors in a pixel circuit, the source region of the semiconductor layer and the wirings of the signal transmission paths are connected via a plurality of source contact holes, and the drain region of the semiconductor layer and the data lines are connected via a plurality of drain contact holes. Therefore, it is possible to stably supply an image signal having a relatively high voltage and high frequency or an image auxiliary input signal to the data lines.

On the other hand, in the active matrix type liquid crystal display device, in a case where it is possible to perform a high-definition display by increasing the number of pixels without changing the size of an active matrix substrate provided with the sample and hold circuit, it is necessary to dispose transistors at a narrow pitch which constitute the sample and hold circuit corresponding to a pixel pitch, that is, a disposition pitch of data lines. However, since in the active matrix substrate, there is a limited region in which the sample and hold circuit may be disposed, JP-A-2003-177376 describes a modification example in which it is possible to dispose the transistors of the sample and hold circuit at a narrow pitch.

Specifically, the modification example discloses that without changing the sizes of source contact holes and drain contact holes, mutual contact holes are alternately disposed at the positions shifted in a direction along data lines, and gate electrodes between the source contact holes and the drain contact holes are formed in a meandering pattern so that the transistors constituting the sample and hold circuit are disposed at a narrow pitch.

Regarding to the electro-optical panel of an electro-optical device, for example, there is disclosed a driving circuit of an electro-optical panel, including a shift register circuit that sequentially outputs transfer signals, a buffer circuit that buffers sequentially output transfer signals, a sampling circuit that samples an image signal using the buffered transfer signals as sampling pulses and supplies the sampled image signal to data lines, and a dummy circuit that simulates at least a part of the buffer circuit and the sampling circuit, in which a delay signal indicating the amount of delay of sampling pulses generated by the dummy circuit is fed back to the shift register circuit such that the amount of delay is reduced (JP-A-2004-361919). It is considered that these buffer circuits, sampling circuits, and dummy circuits are formed on the same substrate.

That is, the sample and hold circuit of JP-A-2003-177376 and the sampling circuit of JP-A-2004-361919 have the same function.

It is difficult to meander the gate electrodes with a certain width from the viewpoint of patterning gate electrodes in the transistors of the sample and hold circuit of JP-A-2003-177376 described above. Therefore, in a case where the widths of gate electrodes vary due to meandering, a channel length in a semiconductor layer opposite to the gate electrodes substantially varies, and there is a possibility that the operations of the sample and hold circuit become unstable.

In order to improve this, it is conceivable to provide a method in which the gate electrodes are linearly formed, and convex portions are provided at positions corresponding to the source contact hole and the drain contact hole alternately disposed in the planar shape of the semiconductor layer. Then, a meandering space is generated between the adjacent semiconductor layers disposed at a narrow pitch. Since an insulating film composed of a material different from the material of the semiconductor layer is present in the space, there is a possibility that a stress is applied to the space to cause cracks in the insulating film, for example, in a case where heat treatment or the like is performed in the manufacturing process of the active matrix substrate. In a case where cracks grow and lead to the semiconductor layer or the wiring connected to the semiconductor layer, there is a possibility that a problem that the sample and hold circuit does not operate properly will occur.

Since the dummy circuit of JP-A-2004-361919 simulates at least a part of the buffer circuit and the sampling circuit, there is a possibility that the above-described problem in the transistor of the sample and hold circuit of JP-A-2003-177376 will also occur in the dummy circuit, for example, in a case where a transistor having the same form as that of the transistor of the sampling circuit is adapted for the dummy circuit.

The gate-source voltage (Vgs) of the transistor of the dummy circuit becomes smaller, as compared with the transistor in the sampling circuit of JP-A-2004-361919. Specifically, the gates of the transistors in the sampling circuit are connected to signal lines to which sampling signals are supplied, and the sources thereof are connected to signal lines to which image signals are supplied. Meanwhile, the gates of the transistors in the dummy circuit are connected to signal lines, to which the input signal is inverted by an inverter or a NAND circuit, delayed and supplied, and the sources thereof are connected to signal lines to which a low potential power supply is supplied. Therefore, the transistors of the dummy circuit are susceptible to variations in the thicknesses of films such as the semiconductor layer, and a gate insulating film in a manufacturing process, and there is a tendency that threshold characteristics is easy to be shifted to the depletion (hereinafter referred to as a "depletion-shift"). In other words, there was a problem that it was necessary to investigate whether units for solving the problem in the sample and hold circuit of JP-A-2003-177376 as it is, may be applied to the transistors of the dummy circuit of JP-A-2004-361919.

SUMMARY

The invention can be realized in the following aspects or application examples.

Application Example 1

According to this application example, there is provided an electro-optical device including a pixel electrode and a switching element provided for each pixel; a data line connected to the switching element; a sample and hold circuit having a sampling transistor, a gate of which is supplied with a selection signal, a source of which is supplied with an image signal, and a drain of which is connected to the data line; and a monitor circuit having a monitoring transistor, a gate of which is supplied with an input signal, a source of which is supplied with a low voltage power supply, and a delay signal indicating the delay amount of the selection signal is sent out from a drain of the monitoring transistor, in which the sampling transistor includes a plurality of transistors connected in parallel to each other, and the monitoring transistor includes one transistor.

According to the application example, by constituting the sampling transistor with a plurality of transistors, a gap generated between the sampling transistors disposed adjacently in accordance with the disposition of the data lines is not continuous in the direction in which the plurality of transistors are disposed, that is, the channel width direction. Therefore, even though a stress due to, for example, heat or the like acts on the insulating film filling the gap, the stress easily disperses, and cracks due to the stress are hardly generated in the insulating film filling the gap. Thus, it is possible to prevent the occurrence of a problem that cracks grow and lead to the semiconductor layer or a wiring connected to the semiconductor layer, so that the sample and hold circuit does not operate properly.

On the other hand, since the monitoring transistor of the monitor circuit is not made of a plurality of transistors like a sampling transistor but is made of one transistor, the monitoring transistor is hardly affected by a variation depending on the manufacturing process of the transistor. Since the monitoring transistor is unnecessary to be disposed in accordance with the disposition of the data lines like the sampling transistor, it is possible to adjust a gap such that cracks are hardly generated in the insulating film filling the gap between the adjacent monitoring transistors. That is, it is possible to provide an electro-optical device in which a sampling transistor and a monitoring transistor are appropriately disposed to obtain a stable driving state.

In the electro-optical device according to the application example, it is preferable that the sampling transistor and the monitoring transistor be provided on a base material, the electro-optical device further include a first light shielding layer provided between the base material and the sampling transistor and a second light shielding layer provided between the base material and the monitoring transistor, the first light shielding layer be divided in a channel width direction of the sampling transistor, and the second light shielding layer be not divided in a channel width direction of the monitoring transistor.

According to this configuration, on the base material, the first light shielding layer disposed under the layer of the sampling transistor is divided in the channel width direction. Therefore, in the adjacent sampling transistors, since the gap between the adjacent first light shielding layers located thereunder also does not be continuous in the channel width direction, cracks are hardly generated in the insulating film filling the gap.

On the other hand, in adjacent monitoring transistors, even though adjacent second light shielding layers located thereunder are not divided, respectively, it is possible to adjust a gap such that cracks are hardly generated in the insulating film filling the gap between the adjacent second light shielding layers.

In the electro-optical device described in the application example, it is preferable that the first light shielding layer be divided in the channel width direction for each of the plurality of transistors constituting the sampling transistor.

According to this configuration, it is easy to further disperse the stress due to, for example, heat or the like applied to the insulating film filling the gap between the adjacent sampling transistors. That is, cracks due to the stress are hardly generated in the insulating film filling the gap.

In the electro-optical device according to the application example, it is preferable that the second light shielding layer be divided in a direction orthogonal to the channel width direction so as to have a gap at a position overlapping the channel of the monitoring transistor.

According to this configuration, since the semiconductor layer of the monitoring transistor is formed on the insulating film filling the gap of the second light shielding layer, the channel length substantially becomes longer in a case where the semiconductor layer is distorted at a portion overlapping the gap. Since, in a case where the channel length becomes longer, the threshold characteristics in the monitoring transistor is enhanced, the threshold characteristics are hardly depletion-shifted depending on manufacturing variations of the monitoring transistor. That is, a monitor circuit capable of obtaining a stable operation is constituted.

In the electro-optical device described in the application example, it is preferable that a length of the gap in a direction orthogonal to the channel width direction be shorter than a channel length of the monitoring transistor.

According to this configuration, even though light from the outside is incident on the gap, a light leakage current in the monitoring transistor is hardly generated.

In the electro-optical device according to the application example, the second light shielding layer may have a convex portion protruding toward the channel at a position overlapping the channel of the monitoring transistor.

According to this configuration, since the semiconductor layer of the monitoring transistor is formed on the insulating film filling the convex portion of the second light shielding layer, the channel length substantially becomes longer in a case where the semiconductor layer is distorted at a portion overlapping the convex portion. Since, in a case where the channel length becomes longer, threshold characteristics in the monitoring transistor are enhanced, the threshold characteristics are hardly depletion-shifted depending on manufacturing variations of the monitoring transistor. That is, a monitor circuit capable of obtaining a stable operation is constituted.

In the electro-optical device described in the application example, it is preferable that the length of the convex portion in a direction orthogonal to the channel width direction be shorter than the channel length of the monitoring transistor.

According to this configuration, the threshold characteristics of the monitoring transistor are not excessively enhanced.

In the electro-optical device described in the application example, it is preferable that the channel width of the sampling transistor and the channel width of the monitoring transistor be the same length.

According to this configuration, since the threshold characteristics of the sampling transistor and the threshold characteristics of the monitoring transistor may be the same, a delay signal is generated from the monitor circuit at an appropriate timing, so that the image signal selected by the sample and hold circuit may be supplied to the data line at an appropriate timing.

In the electro-optical device according to the application example, it is preferable that each of the sampling transistor and the monitoring transistor have a plurality of source contacts and a plurality of drain contacts disposed with a linear gate line serving as a gate electrode interposed therebetween, and the plurality of source contacts and the plurality of drain contacts be disposed so as to be shifted in an extending direction of the gate line.

According to this configuration, even though the disposition pitch of pixels, that is, the disposition pitch of data lines becomes narrow, it is possible to dispose the sampling transistors at a narrow pitch correspondingly. Since monitoring transistors may be also disposed at a narrow pitch, it is possible to reduce a region in which monitor circuits are disposed. In addition, since the gate lines are linear, it is easy to pattern the gate lines, and it is possible to suppress the variation of the width of the gate electrode, that is, substantially, the channel length of each transistor.

Application Example 2

An electronic apparatus according to this application example is characterized by including the electro-optical device described in the application example.

According to the application example, it is possible to provide an electronic apparatus including an electro-optical device having stable operation and high reliability quality.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
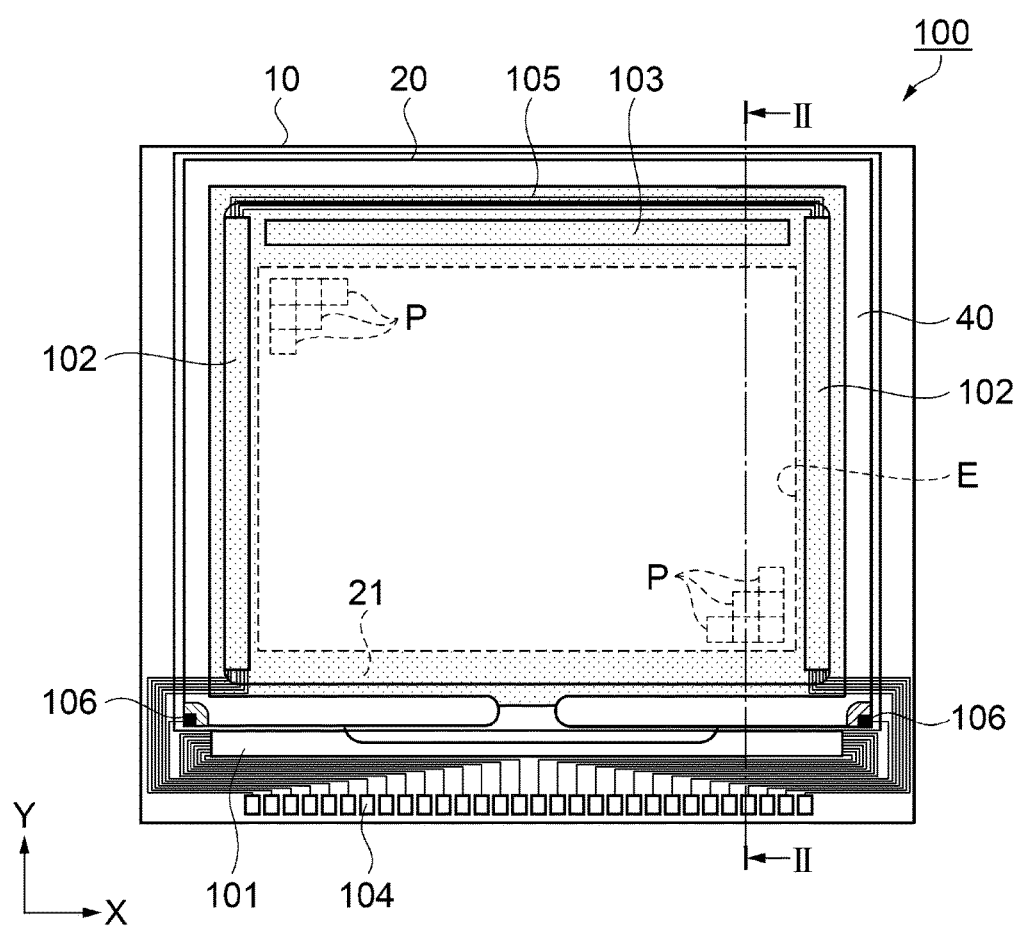
FIG. 1 is a schematic plan view showing a configuration of a liquid crystal device.

As below, embodiments in which the invention is embodied will be described with reference to the drawings. In the drawings for use, the described portions are appropriately scaled up and down to be recognizable.

In the present embodiment, an active matrix type liquid crystal device including a thin film transistor (hereinafter, referred to as a "TFT") as a switching element of a pixel will be described as an example of an electro-optical device. This liquid crystal device may be suitably used as, for example, a light modulation element (a liquid crystal light valve) of a projection type display device (a liquid crystal projector) to be described later.

First Embodiment

Electro-Optical Device

First, a schematic configuration of a liquid crystal device as an electro-optical device of this embodiment will be described with reference to FIGS. 1 and 2. FIG. 1 is a schematic plan view showing a configuration of a liquid crystal device, and FIG. 2 is a schematic sectional view taken along the line II-II of the liquid crystal device shown in FIG. 1.

Figure 2:
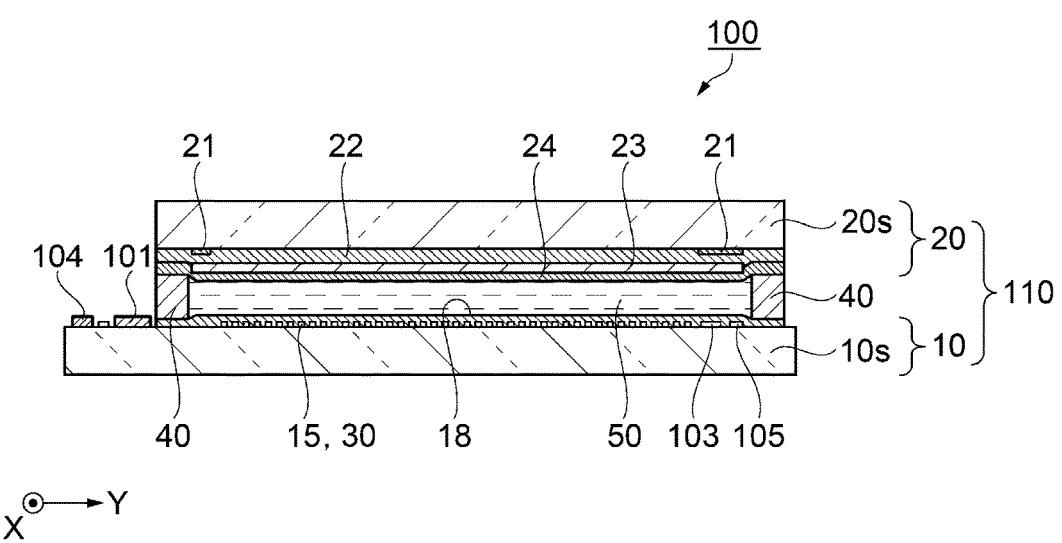
FIG. 2 is a schematic sectional view taken along the line II-II of the liquid crystal device shown in FIG. 1.

As shown in FIGS. 1 and 2, a liquid crystal device 100 as an electro-optical device of this embodiment includes an element substrate 10 and an opposing substrate 20 that are disposed opposite to each other, and a liquid crystal layer 50 sandwiched between the pair of substrates. For the base material 10s of the element substrate 10 and the base material 20s of the opposite substrate 20, for example, a transparent quartz substrate or a glass substrate are used.

The element substrate 10 is slightly larger than the opposite substrate 20, both substrates are adhered via a sealing material 40 disposed in a frame shape, and liquid crystal having positive or negative dielectric anisotropy is sealed in a gap between the substrates, thereby constituting the liquid crystal layer 50. As the sealing material 40, for example, an adhesive such as a thermosetting or ultraviolet curable epoxy resin is adopted. In the sealing material 40, a spacer (not shown) for keeping an interval between the pair of substrates constant is mixed.

On the inner side of the sealing material 40 disposed in a frame shape, a parting portion 21 is provided, similarly in the frame shape. The parting portion 21 includes, for example, a light shielding metal or a metal oxide, and the inner side of the parting portion 21 is a display region E having a plurality of pixels P. The display region E may include dummy pixels disposed so as to surround the plurality of pixels P in addition to the plurality of pixels P contributing to display.

A plurality of external connection terminals 104 are disposed along one side portion of the element substrate 10 protruding from the opposite substrate 20. A data line driving circuit 101 is provided between the sealing material 40 along the one side portion of the element substrate 10 and the one side portion. An inspection circuit 103 is provided on the inner side of the sealing material 40 along the other side portion opposed to the one side portion. Furthermore, a scanning line driving circuit 102 is provided on inner side of the sealing material 40 along the other two side portions which are orthogonal to the one side portion and opposed to each other. On the inner side of the sealing material 40 of the other side portion opposite to the one side portion, a plurality of wirings 105 connecting two scanning line driving circuits 102 are provided.

The wirings connected to the data line driving circuit 101 and the scanning line driving circuit 102 are connected to a plurality of external connection terminals 104 disposed along the one side portion. The disposition of the inspection circuit 103 is not limited thereto, and may be provided at a position along the inner side of the sealing material 40 between the data line driving circuit 101 and the display region E. Hereinafter, a direction along the one side portion will be described as an X direction, and a direction along the other two side portions which are orthogonal to the one side portion and opposed to each other will be described as a Y direction. What is viewed from the opposite substrate 20 side is referred to as "in a plan view" or "in a plane".

As shown in FIG. 2, on the surface of the element substrate 10 on the side of the liquid crystal layer 50, a light-transmitting pixel electrode 15 provided for each pixel P, a thin film transistor (TFT) 30 as a switching element, a signal wiring, and an alignment film 18 covering them are formed. There is adopted a light shielding structure in which light is prevented from being incident on the semiconductor layer in the TFT 30 so as to prevent a switching operation from being unstable.

On the surface of the opposite substrate 20 on the side of the liquid crystal layer 50, a parting portion 21, a planarizing layer 22 formed so as to cover the parting portion 21, an opposite electrode 23 provided so as to cover the planarizing layer 22 and to serve as a common electrode, and an alignment film 24 covering the opposite electrode 23 are provided.

As shown in FIG. 1, the parting portion 21 is provided in a frame shape at a position overlapping the scanning line driving circuits 102 and the inspection circuit 103 in a plane. Therefore, by shielding the light which is incident from the opposing substrate 20 side, the parting portion 21 is in charge of preventing a malfunction caused by the light of peripheral circuits including these driving circuits. Since unnecessary stray light is shielded so as not to be incident on the display region E, a high contrast in the display of the display region E is secured.

The planarizing layer 22 includes an inorganic material such as a silicon oxide, and is provided so as to have light permeability and cover the parting portion 21. As a method of forming such a planarizing layer 22, there may be mentioned a method in which a silicon oxide film is formed using, for example, a plasma CVD method or the like and the surface thereof is subjected to a planarizing treatment such as a CMP treatment.

The opposite electrode 23 includes a transparent conductive film such as an indium tin oxide (ITO) or the like, covers the planarizing layer 22, and is electrically connected to the wirings on the element substrate 10 side by vertical conduction portions 106 which are provided at the corners of the opposite substrate 20 on the data line driving circuit 101 side as shown in FIG. 1.

The alignment film 18 covering the pixel electrode 15 and the alignment film 24 covering the opposite electrode 23 are selected based on the optical design of the liquid crystal device 100. For example, as these alignment films, there may be mentioned alignment films obtained by performing a substantially horizontal alignment treatment on liquid crystal molecules by forming an organic material such as polyimide into a film and rubbing the surface of the film, or performing a substantially vertical alignment treatment on liquid crystal molecules by forming an inorganic material such as SiOx (a silicon oxide) into a film using a vapor deposition method.

Such a liquid crystal device 100 is a transmission type, and there are adopted optical designs of a normally white mode in which a pixel P is displayed in a bright state during a non-driving time, or a normally black mode in which a pixel P is displayed in a dark state during a non-driving time. Polarizing elements are disposed for use on the incident side and the emission side of light, respectively, depending on the optical design.

Figure 3:
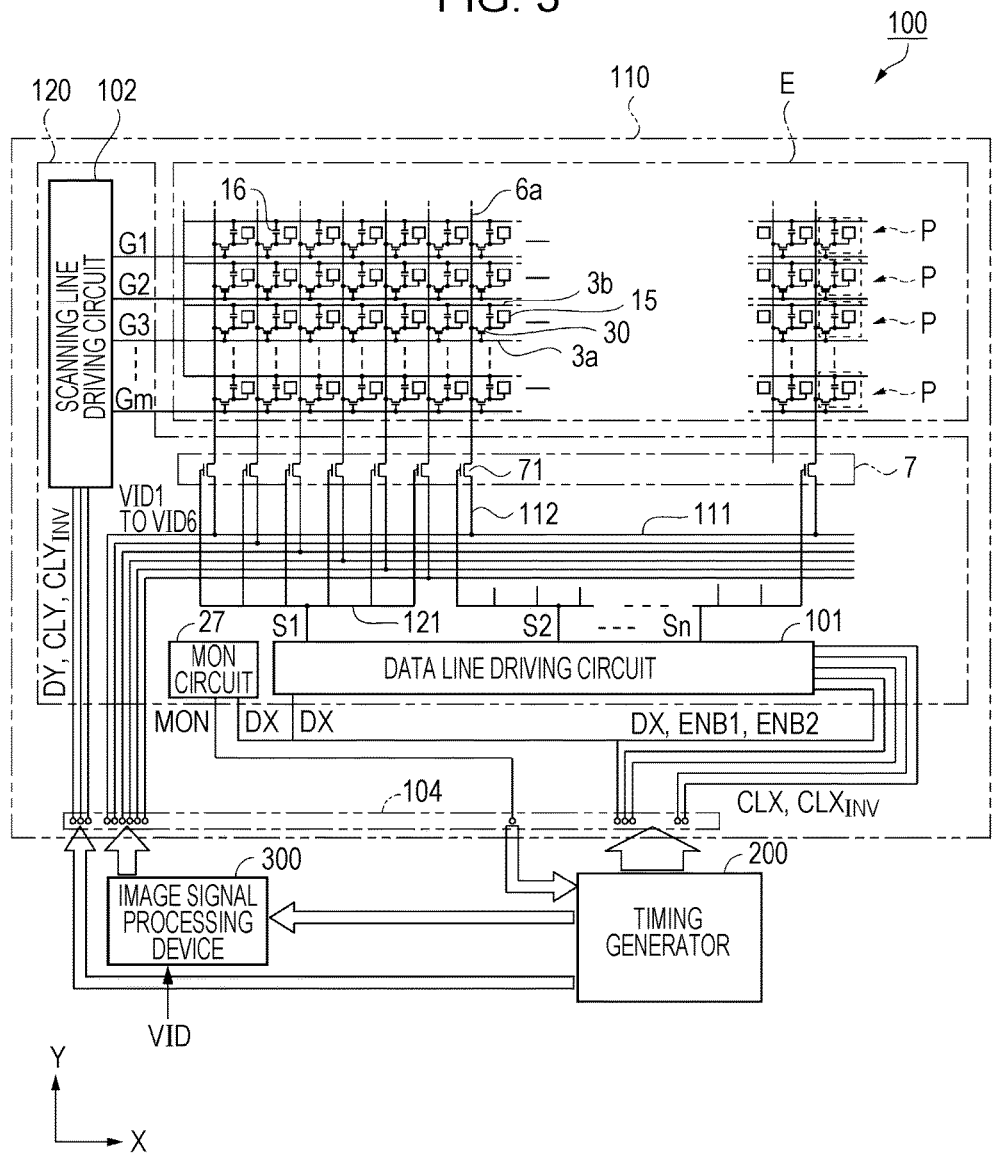
FIG. 3 is a circuit diagram showing a main circuit configuration of a liquid crystal device.

Next, an electrical configuration of the liquid crystal device 100 will be described with reference to FIG. 3. FIG. 3 is a circuit diagram showing a main circuit configuration of the liquid crystal device.

As shown in FIG. 3, the liquid crystal device 100 includes a liquid crystal panel 110 for which a driving circuit 120 is provided, a timing generator 200, and an image signal processing device 300. The driving circuit 120 in the embodiment includes the above-mentioned data line driving circuit 101 and the scanning line driving circuit 102, the sample and hold (SH) circuit 7, and the monitor (MON) circuit 27. The driving circuit 120 is formed in the element substrate 10 of the liquid crystal panel 110. The timing generator 200 and the image signal processing device 300 are electrically connected to the driving circuit 120 of the liquid crystal panel 110 via the external connection terminals 104 of the liquid crystal panel 110.

The liquid crystal panel 110 has a plurality of scanning lines 3a extending in the X direction and a plurality of data lines 6a extending in the Y direction in the display region E occupying the central portion of the element substrate 10. A plurality of pixels P disposed in a matrix form in the X direction and the Y direction are provided corresponding to the intersections of the scanning lines 3a and the data lines 6a. A pixel electrode 15, a TFT 30 as a switching element for switching-controlling the pixel electrode 15, and a holding capacitor 16 are provided for each of the plurality of pixels P. The data line 6a, to which an image signal (VID1 to VID6) is supplied, is electrically connected to the source of the TFT 30. The scanning line 3a, to which a scanning signal (G1, G2, and, . . . , Gm) is supplied, is connected to the gate of the TFT 30. One electrode of the pixel electrode 15 and the holding capacitor 16 is connected to the drain of the TFT 30. The other electrode of the holding capacitor 16 is connected to a capacitor line 3b disposed in parallel to the scanning line 3a. The capacitor line 3b may be disposed in parallel to the data line 6a or disposed in a matrix form, and is connected to a fixed potential (for example, LCCOM).

The SH circuit 7 includes a plurality of sampling transistors (hereinafter, referred to as "S-TFT") 71 composed of an N-channel type of a single channel TFT or a complementary type TFT. The gates of six S-TFTs 71, to which mutually adjacent six data lines 6a are respectively connected, are gathered at one and connected to one selection signal supply line 121. That is, each selection signal (S1, S2, and, . . . , Sn) from the data line driving circuit 101 is supplied using six S-TFTs 71 as one unit (series). Anyone of six image signal lines 111 is connected to the sources of the six S-TFTs 71 constituting one unit (series) via a connection wiring 112. A data line 6a is connected to the drain of an S-TFT 71. In a case where the selection signal (S1, S2, and, . . . , Sn) is input, the SH circuit 7 sequentially supplies the data lines 6a corresponding to the six S-TFTs 71 constituting one unit (series) with the image signals (VID1 to VID6) in response to a selection signal (S1, S2, and, . . . , Sn).

Selection signal S1, S2, and, . . . , Sn to be supplied using the six S-TFTs 71 of the SH circuit 7 as one unit (series) may be sequentially supplied in this order, or may be supplied to the S-TFTs 71 corresponding to adjacent six data lines 6a for each series.

As shown in FIG. 3, in a case where the image signal VID of one system is input, the image signal processing device 300 of the embodiment performs serial-parallel conversion on the image signal VID into six-phase image signals (VID1 to VID6) and outputs the six-phase image signals. In the embodiment, the selection signal (S1, S2, and, . . . , Sn) are configured to be supplied to a set of six data lines 6a corresponding to each of the image signals (VID1 to VID6) serial-parallel developed into six phases for each group (series). Regarding to the number of phase developments of the image signals (VID1 to VID6) (that is, the number of series of image signals to be serial-parallel developed), the number of phase developments is not limited to six phases, but image signals, which are developed into a plurality of phases such as nine phases, twelve phases, and twenty-four phases, may be configured to be supplied to a set of the number of data lines 6a which correspond to the number of phase developments as one set.

The scanning line driving circuit 102 has a shift register and outputs scanning signals (G1, G2, and, . . . , Gm) based on a clock signal CLY from the timing generator 200 or an inverted clock signal $CLY_{INV}$ of the clock signal, a transfer start pulse DY, and the like.

Scanning signals (G1, G2, and, . . . , Gm) are configured to be sequentially applied to the scanning lines 3a in this order in a pulse manner at a predetermined timing from the scanning line driving circuit 102. As mentioned above, the pixel electrode 15 is electrically connected to the drain of the TFT 30, the TFT 30 is turned on for a certain period by the scanning signals (G1, G2, and, . . . , Gm), and the image signals (VID1 to VID6) supplied from the data line 6a are written into the pixel electrode 15 at predetermined timing.

Furthermore, in order to prevent the image signals (VID1 to VID6) held in each pixel P from leaking, a holding capacitor 16 is added in parallel to the liquid crystal capacitor formed between the pixel electrode 15 and the opposite electrode 23.

The image signals (VID1 to VID6) of a predetermined level written in the liquid crystal layer 50 (see FIG. 2) via the pixel electrode 15 are held for a certain period between the pixel electrode 15 and the opposite electrode 23 formed in the opposite substrate 20. The liquid crystal layer 50 modulates the light transmitted through the liquid crystal layer 50 by changing the orientation and order of the liquid crystal molecules according to the applied voltage level, thereby enabling the gradation display. In the case of the normally white mode, the transmittance for incident light decreases according to the voltage applied in a unit of each pixel P to make a dark display, resulting in a dark display, and in the case of the normally black mode, the transmittance for incident light increases according to the voltage applied in a unit of each pixel P, resulting in a bright display. As a whole, the liquid crystal device 100 emits the display light having the contrast according to the image signals (VID1 to VID6) to perform display. The image signals (VID1 to VID6) are configured by combining a potential pulse having a positive polarity with respect to a reference potential and a potential pulse having a negative polarity in order to AC-drive the liquid crystal layer 50. The driving method of the liquid crystal device 100 as described above is called phase development driving method. The electrical configuration of the liquid crystal device 100 is not limited thereto, but may include, for example, a precharge circuit that supplies a precharge signal having a predetermined level of voltage to the data line 6a prior to the image signals (VID1 to VID6).

Figure 4:
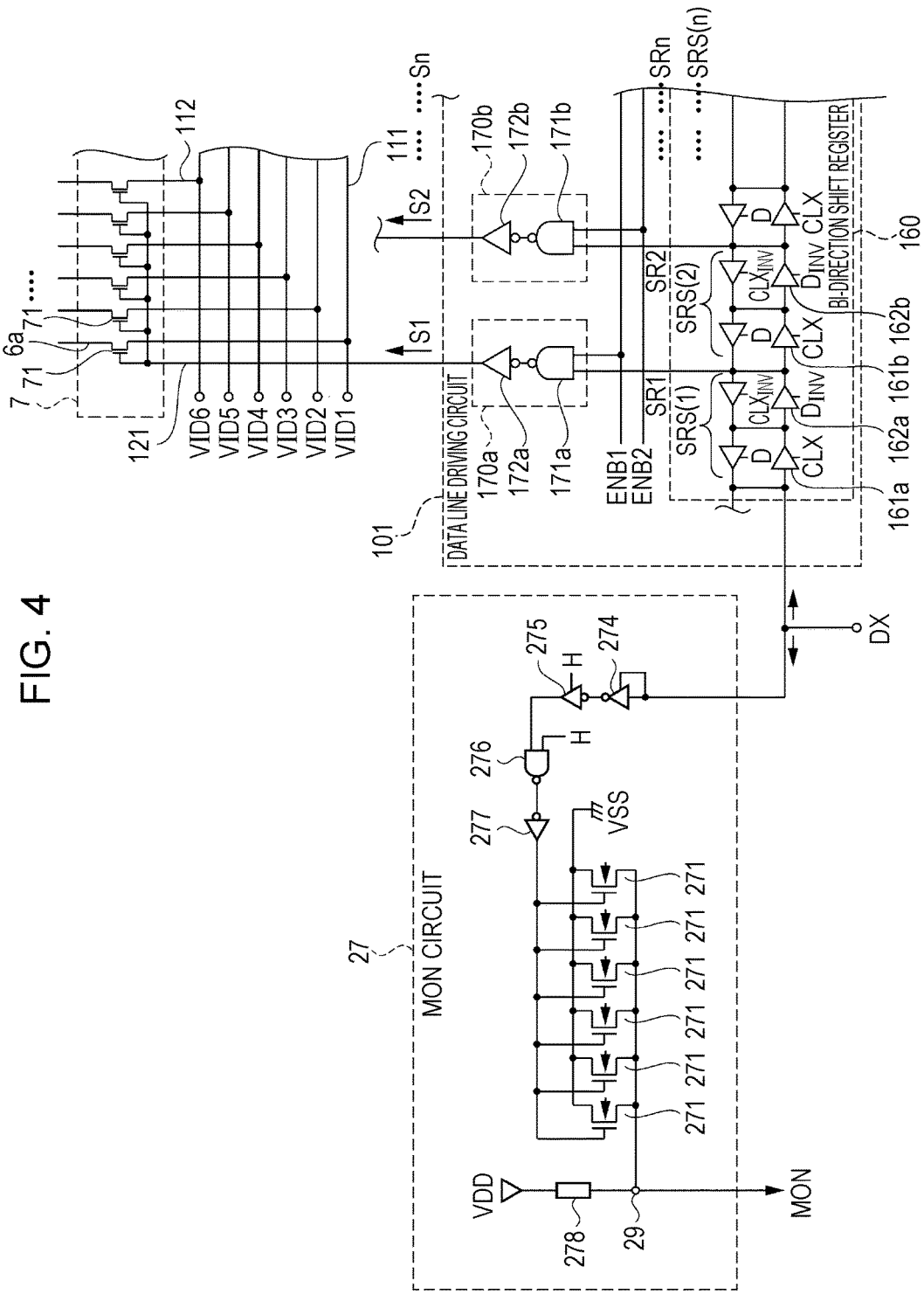
FIG. 4 is a circuit diagram showing an example of an electrical configuration of a data line driving circuit and a sample and hold circuit.
Figure 5:
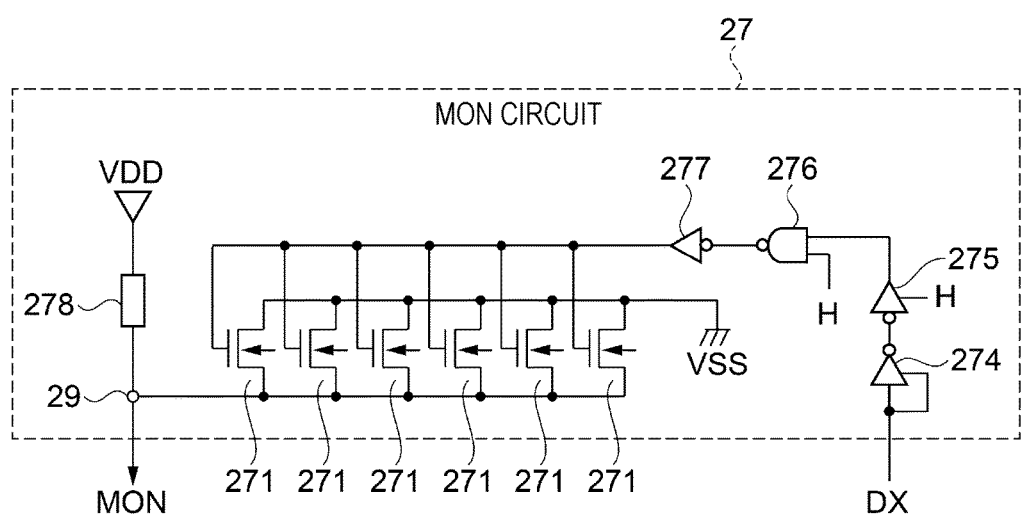
FIG. 5 is a circuit diagram showing an example of an electrical configuration of a monitor circuit.
Figure 6:
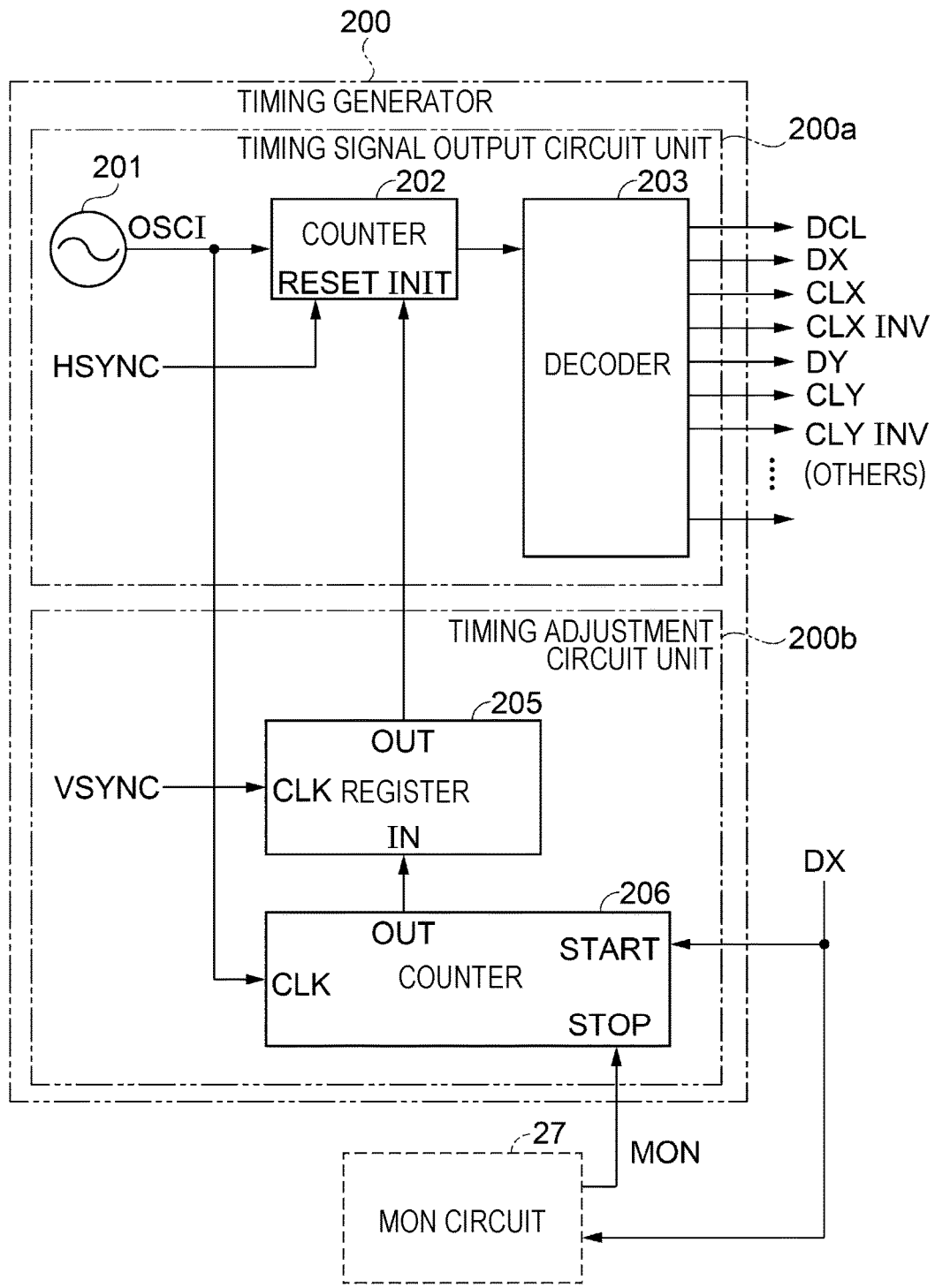
FIG. 6 is a block diagram showing an example of an electrical configuration of a timing generator.

Next, the electrical configuration of the data line driving circuit 101, the sample and hold (SH) circuit 7, the monitor (MON) circuit 27, and the timing generator 200 will be described with reference to FIGS. 4 to 6. FIG. 4 is a circuit diagram showing an example of an electrical configuration of a data line driving circuit and a sample and hold circuit, FIG. 5 is a circuit diagram showing an example of an electrical configuration of the monitor circuit, and FIG. 6 is a block diagram showing an example of an electrical configuration of the timing generator.

As shown in FIG. 4, the data line driving circuit 101 of the embodiment includes a bidirectional shift register 160 for enabling the data line 6a to be sequentially driven from both directions. A shift direction is determined by a direction control signal D. In a case where the direction control signal D is at a high level (H), the transfer start pulse DX is input to the bidirectional shift register 160 from the left side and sequentially shifted from the left to the right so that transfer signals SR1 to SRn are output from each stage SRS(i) (where i=1, 2, 3, and, . . . , n) of the bidirectional shift register 160. In a case where a reverse direction control signal $D_{INV}$ is positive, the transfer start pulse DX is input from the right direction of the bidirectional shift register 160 and sequentially shifted from the right to the left.

Each of the enable circuits 170, which is an example of a buffer circuit, is disposed between the bidirectional shift register 160 and the SH circuit 7, and is constituted with a NAND circuit 171 and an inverter 172.

The transfer signals SR1 to SRn output from the bidirectional shift register 160 are supplied to the enable circuits 170 (170a, 170b, and, . . . ). Enable signals ENB1 and ENB2 are input to the other inputs of the enable circuits 170 (170a, 170b, and, . . . ), respectively. Therefore, the data line 6a is driven only in a case where the transfer signals SR1 to SRn are output and the enable signals ENB1 or ENB2 are output. That is, control is performed by the enable signal ENB1 or the enable signal ENB2 so that the data line 6a is activated in a case where the image signal VID is stalely output.

The transfer signals SR1 to SRn are supplied to the SH circuit 7 as selection signal (S1 to Sn) after the transfer signals SR1 to SRn are ANDed with an enable signal by the enable circuits 170 (170a, 170b, and, . . . ). The SH circuit 7 includes a plurality of sampling transistors (S-TFT) 71 as sampling switches. As mentioned above, the six data lines 6a are used as one unit (series), and with respect to data lines 6a belonging to these units (series), the image signals (VID1 to VID6) which are serial-parallel developed into six phases according to the selection signal (S1 to Sn) are respectively sampled and are sequentially supplied to each of data lines 6a. The gate electrodes of the S-TFTs 71 of the SH circuit 7 are connected to one of the connection wirings 112 to which selection signal (S1 to Sn) corresponding to the group are supplied. In the embodiment, since the image signals (VID1 to VID6) are simultaneously supplied, the image signals are simultaneously sampled by the selection signal S1.

In a case where the image signals (VID1 to VID6) are supplied at the sequentially shifted timing, sampling is sequentially performed according to the selection signal (S1 to Sn).

As shown in FIGS. 4 and 5, the monitor (MON) circuit 27 of the embodiment simulates the configurations of the data line driving circuit 101 and the sample and hold (SH) circuit 7, and includes a clocked inverter 274 corresponding to a clocked inverter 161 (161a, 161b, and, . . . , and the like) and a clocked inverter 275 corresponding to a clocked inverter 162 (162a, 162b, and, . . . , and the like) constituting a shift register. Furthermore, the monitor (MON) circuit 27 includes a NAND circuit 276 corresponding to the NAND circuit 171 (171a, 171b, and, . . . , and the like) constituting the buffer circuit (enable circuit) and an inverter circuit 277 corresponding to the inverter 172 (172a, 172b, and, . . . , and the like) constituting the buffer circuit (enable circuit). Furthermore, the monitor (MON) circuit 27 is configured to include a monitoring transistor (M-TFT) 271 corresponding to the sampling transistor (S-TFT) 71 constituting the SH circuit 7. Similarly, in the MON circuit 27, the transfer start pulse DX, which is input to the data line driving circuit 101, is input to the clocked inverter 274. The transfer start pulse DX corresponds to the input signal in the invention and is hereinafter referred to as the input signal DX. The source of an M-TFT 271 is connected to a low voltage power supply Vss in the driving circuit 120, and the drain thereof is connected to the detection terminal 29 in the driving circuit 120. The detection terminal 29 is connected to a counter 206 (see FIG. 6) in the timing generator 200 to be described later, and the detection signal MON detected in the MON circuit 27 is output to the counter 206. Furthermore, the detection terminal 29 is connected via a load resistor 278 to a high voltage power supply VDD in the internal power supply of the liquid crystal device 100, and is biased to a high potential.

With reference to FIG. 4, as described above, the six S-TFTs 71 in the SH circuit 7 are connected in parallel to each stage SRS(i) of the bidirectional shift register 160 (where i=1, 2, 3, and, . . . , n), and similarly, six M-TFTs 271 in the MON circuit 27 which simulates the SH circuit, are connected in parallel. In other words, the number of M-TFTs 271 constituting one MON circuit 27 is the same as the number of S-TFTs 71 provided corresponding to one unit (series) of the data lines 6a.

With the above configuration, the MON circuit 27 simulates a path corresponding to one stage of the bidirectional shift register 160 from the bidirectional shift register 160 to the SH circuit 7. Therefore, simultaneously with the sampling operation of the image signal VID in the SH circuit 7 by the selection signal (S1, S2, and, . . . , Sn) generated by the data line driving circuit 101, in the MON circuit 27 simulating the selection signal, a delay signal indicating the delay amount of the selection signal is generated and detected as the detection signal MON at the detection terminal 29. As shown in FIG. 3, the detection signal MON is input to the timing generator 200. In the timing generator 200, a delay time is measured based on the detection signal MON. The detection signal MON, which is the delay signal in the MON circuit 27, is fed back via the timing generator 200 to the bidirectional shift register 160 of the data line driving circuit 101 such that the delay amount of the selection signal is reduced.

The accuracy of the measurement of the delay time measured by the timing generator 200 is determined based on how the characteristics of the MON circuit 27 which is the detection circuit of the delay signal is close to the characteristics of the SH circuit 7 and the data line driving circuit 101. Therefore, by configuring in the above-described manner, the MON circuit 27 may detect the delay time of the selection signal with relatively high accuracy, and it is possible to reduce an adverse effect on the display image due to the delay of the selection signal, for example, a so-called ghost that the display image is doubly displayed as the image signals (VID1 to VID6) are applied to the selected data lines 6a at the timing later than a predetermined timing, or the like.

In the embodiment, the MON circuit 27 is formed on the element substrate 10 of the liquid crystal panel 110 in the same process as each element of the data line driving circuit 101 and the SH circuit 7 which are targets to be simulated, and each element in the MON circuit 27 is formed to have the same size as each element in the SH circuit 7 and the data line driving circuit 101, respectively. The channel width of the M-TFT 271 is formed to be equal to the channel width of the corresponding S-TFT 71.

By configuring in the above-described manner, the degree to which the MON circuit 27 simulates the data line driving circuit 101 and the SH circuit 7 is further enhanced, and it is possible to detect the delay amount of the selection signal with extremely high accuracy.

Furthermore, in the embodiment, the M-TFT 271 is made of an n-channel type TFT. Therefore, since electrons as carriers move between the drain and the source, the mobility of carriers is high as compared with a case of being formed of a p-channel type TFT (in this case, carriers are holes), for example, and switching reaction speed relative to an "ON" of the input signal DX to the gate (corresponding to an "OFF" of the input signal DX in the case of the p-channel) is fast. Therefore, it is possible to detect the delay signal with relatively high accuracy.

In a case where the S-TFT 71 in the SH circuit 7 is formed of a p-channel type TFT, the M-TFT 271 in the MON circuit 27 which simulates the SH circuit, may be similarly made of a p-channel type TFT. Even though a p-channel type TFT is used, the S-TFT 71 is faithfully simulated, and then the same effect may be obtained from the viewpoint of accurately detecting the delay amount of the selection signal and reducing the adverse effect due to the delay. The detailed configurations of the S-TFT 71 of the SH circuit 7 and the M-TFT 271 of the MON circuit 27 will be described later.

Next, with reference to FIG. 6, an electrical configuration of the timing generator 200 will be described. As shown in FIG. 6, the timing generator 200 includes a timing signal output circuit unit 200a and a timing adjustment circuit unit 200b.

The timing signal output circuit unit 200a includes an oscillation circuit 201, a counter 202, and a decoder 203. The oscillation circuit 201 outputs a clock signal OSCI having a frequency which is several times as high as a dot clock DCL. The counter 202 is reset in synchronization with the rising edge of a horizontal synchronization signal HSYNC, and the counter 202 counts the number of pulses of the clock signal OSCI after being reset. Here, the counter 202 is provided with an initial value input terminal INIT to which the initial value of a count value at the time of being reset is input. The decoder 203 decodes the output value of the counter 202 to output various timing signals such as the above-described dot clock DCL, transfer start pulses DX and DY, transfer clock signals CLX and CLY, and inverted clock signals $CLX_{INV}$ and $CLY_{INV}$, or the like.

The timing adjustment circuit unit 200b includes a register 205 and a counter 206. In a case where a signal at the input terminal START of the counter 206 rises to a high level (H), the counter 206 starts counting the clock signal OSCI, and in a case where a signal at the input terminal STOP thereof rises to the high level (H), the counter 206 terminates the counting. The register 205 is storage unit and latches the count result of the counter 206 in synchronization with the vertical synchronization signal VSYNC.

Here, in particular, an output pulse (the detection signal MON) from the above-described MON circuit 27 is input to the counter 206. The count result of this output pulse indicates the delay time of the selection signal in the buffer circuit or the sample and hold circuit. Since the initial value in the counter 202 is preset based on the count result, the timing signals such as the dot clock DCL, the input signal DX, and the transfer clock signal CLX to be output from the decoder 203 are output at an earlier timing by a time corresponding to the count result. That is, the timing adjustment circuit unit 200b measures the delay time by counting the output pulse from the MON circuit 27 by the operation as described above, and it is possible to perform the timing adjustment of the transfer clock signals CLX and CLY based on the measured delay time.

As described above, in the embodiment, the MON circuit 27 generates the detection signal MON which is an example of the "delay signal indicating the delay amount of the selection signal" according to the invention. The detection signal MON is fed back via the timing generator 200 to the bidirectional shift register 160 of the data line driving circuit 101 such that the delay amount of the selection signal (S1 to Sn), which are an example of the "selection signal" according to the invention, is reduced.

Figure 7:
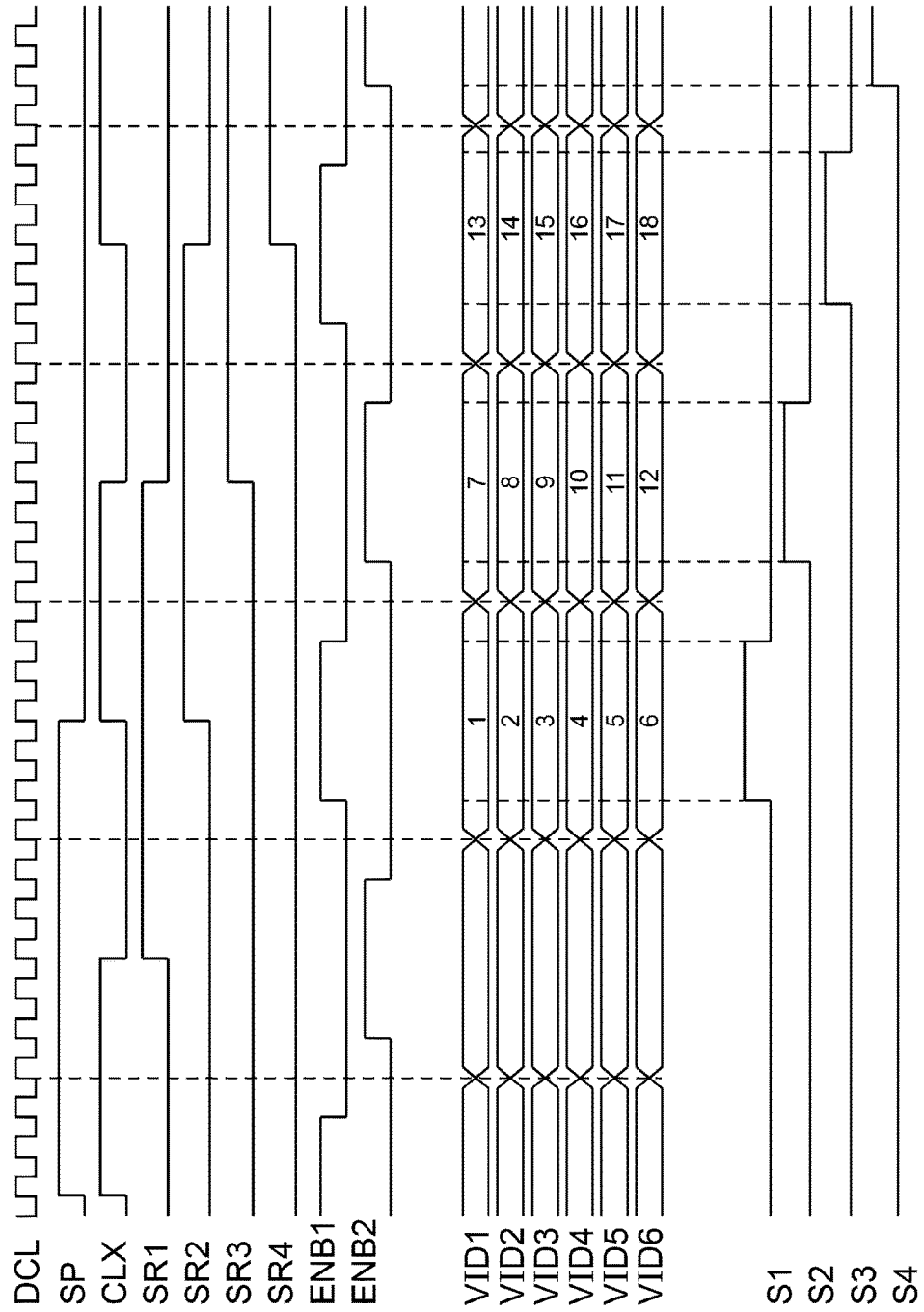
FIG. 7 is a timing chart showing the states of main signals in the logic circuit of FIG. 4.
Figure 8:
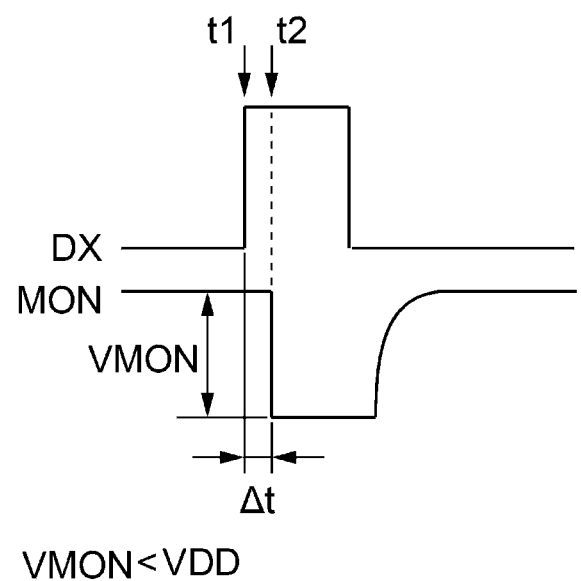
FIG. 8 is a timing chart showing the detection state of a detection signal MON in a monitor circuit.

Next, the timings of the above-described various signals will be specifically described with reference to FIGS. 7 and 8. FIG. 7 is a timing chart showing the states of the main signals in the logic circuit of FIG. 4, and FIG. 8 is a timing chart showing the detection state of the detection signal MON in the monitor circuit.

As shown in FIG. 7, the transfer start pulse DX input to the bidirectional shift register 160 is shifted in a unit of the half cycle of the transfer clock signal CLX by the transfer clock signal CLX and the inverted clock signal $CLX_{INV}$ thereof, and transfer signals SR1 to SRn delayed by the half cycle of the transfer clock signal CLX are sequentially output from each output stage of the bidirectional shift register 160.

In order to synchronize the driving period of the data lines 6a with the stable output period of the image signals (VID1 to VID6), the transfer signals SR1 to SRn are ANDed with the enable signal ENB by the enable circuits 170a and 170b so that the transfer signals SR1 to SRn are output as the selection signal (S1 to Sn). Therefore, the image signals (VID1 to VID6) are synchronized with the selection signal (for example, S1) to enable a correct display.

In the embodiment, ENB1 or ENB2 are supplied in accordance with even-numbered stages or odd-numbered stages of the bidirectional shift register 160, but it is also possible to perform sampling with one ENB signal.

Alternatively, each of the transfer signals SR1 to SRn output from each stage SRS(i) (where i=1, 2, 3, and, . . . , n) of the bidirectional shift register 160 is divided into a plural number and output in parallel, and a plurality of selection signal which are ANDed with a plurality of enable signals corresponding to the number may be output. That is, each stage SRS(i) of the bidirectional shift register 160 controls a group of a plurality of sample and hold (SH) circuit, respectively, and it is possible to reduce the number of stages of the bidirectional shift register 160.

As shown in FIG. 8, in the monitor (MON) circuit 27, a time difference $\Delta t$ between a time t1 at the rising edge of the transfer start pulse (input signal) DX to the high level (H) and a time t2 at the falling edge of the detection signal MON is generated due to the signal delay in a case of passing through each element (clocked inverter 274 to inverter 277) inside the MON circuit 27 and the operation of the monitoring transistor (M-TFT) 271. At this time, since the rising edge of the input signal DX and the falling edge of the detection signal MON are compared and counted by the counter 206 of the timing generator 200, this $\Delta t$ is measured as the delay time of the selection signal.

In this manner, since the MON circuit 27 according to the embodiment detects a falling edge from a state in which the potential is biased to the detection terminal 29, the operation time of the switching itself within the $\Delta t$ may be small enough to be negligible, similarly to the actual sampling transistor (S-TFT) 71. Accordingly, it is possible to detect a delay time as the delay amount of the selection signal with relatively high accuracy, and to perform an adjustment corresponding to the delay time.

Furthermore, in the embodiment, since the high voltage power supply VDD, which is reduced in pressure via the load resistor 278, is applied to the detection terminal 29 from which the detection signal MON is output, the drain of the M-TFT 271 is biased to a relatively low potential. In the method of detecting the falling edge of the detection signal MON as in the MON circuit 27 of the embodiment, since the switching operation of the M-TFT 271 is started in a case where a signal level input to the gate is equal to or higher than a threshold voltage, the detection of the delay signal is not affected by a potential to be biased to the drain. Therefore, it is possible to previously reduce the high voltage power supply VDD in pressure by optionally setting the load resistor 278, and cause a relatively low potential to be biased to the drain of the M-TFT 271. Therefore, it is possible to suppress withstand voltage characteristics needed for the M-TFT 271 at a low level.

Next, the configuration and structure of the sample and hold (SH) circuit 7 and the monitor (MON) circuit 27 of the embodiment will be specifically described.

Sample and Hold Circuit

Figure 9:
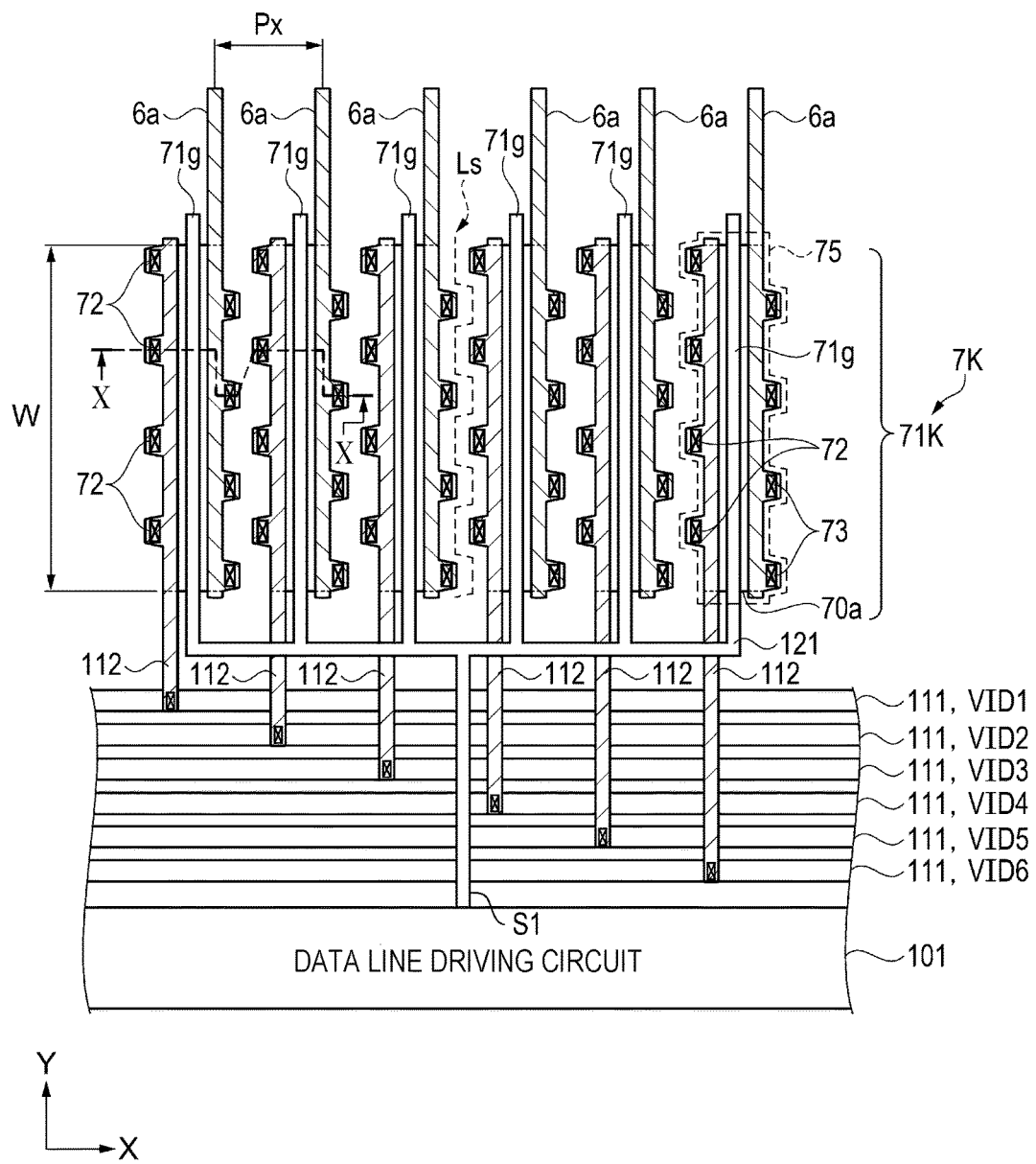
FIG. 9 is a schematic plan view showing the configuration and disposition of an example of a sample and hold circuit of the related art.
Figure 10:
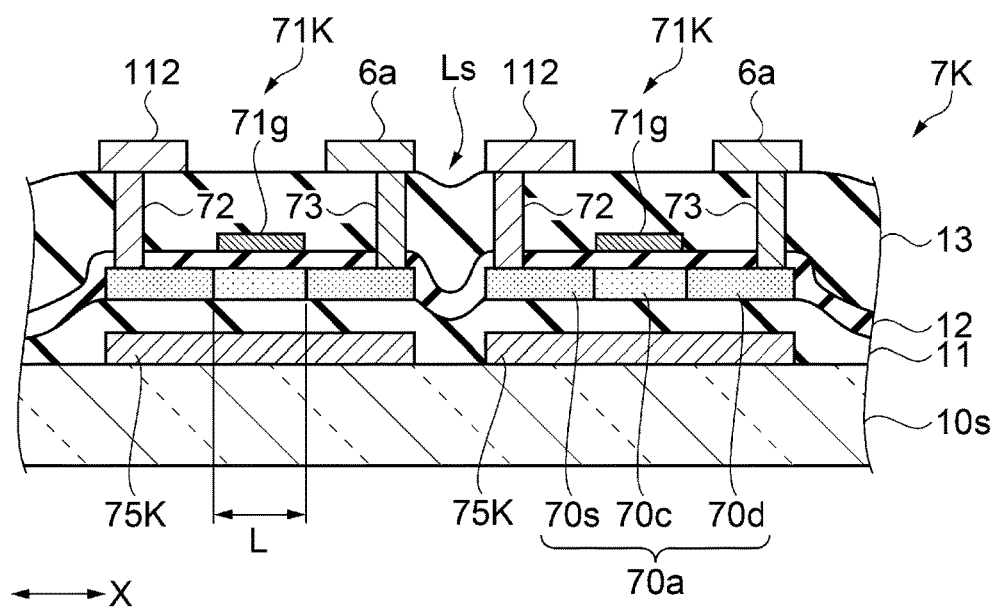
FIG. 10 is a schematic sectional view showing the structure of the sampling transistor of the related art, taken along the line X-X in FIG. 9.

First, before describing the sample and hold (SH) circuit 7 of the embodiment, an example of a sample and hold circuit of the related art will be described with reference to FIGS. 9 and 10. FIG. 9 is a schematic plan view showing the configuration and disposition of an example of the sample and hold circuit of the related art, and FIG. 10 is a schematic sectional view showing the structure of the sampling transistor of the related art, taken along the line X-X of FIG. 9. In the sample and hold circuit of the related art, the same reference numerals are assigned to the same components as the components of the sample and hold circuit 7 of the embodiment, which will be described.

As shown in FIG. 9, the sample and hold circuit 7K in the example of the related art has a sampling transistor (S-TFT) 71K so as to select and supply the image signals (VID1 to VID6) corresponding to each of data lines 6a using six data lines 6a as one unit (series).

The S-TFT 71K has a semiconductor layer 70a which is provided in an island shape corresponding to each of data lines 6a. The semiconductor layer 70a is made of, for example, polysilicon, and has a source region and a drain region formed by selectively introducing impurity ions, and a channel region between the source region and the drain region. The semiconductor layer 70a is a substantially rectangular shape extending in the Y direction in a plan view. Similarly, a gate line 71g, which functions as a gate electrode to face the channel region of the semiconductor layer 70a, is linearly provided extending in the Y direction.

In the semiconductor layer 70a, a source contact 72 connected to the source region at the position sandwiching the gate line 71g in the X direction, and a drain contact 73 connected to the drain region are provided. The source contact 72 and the drain contact 73 are alternately disposed at positions shifted from each other in the Y direction. In other words, the semiconductor layer 70a has a plurality of portions (in this case, eight portions) that protrude in the X direction in a plan view, corresponding to the source contact 72 and the drain contact 73 which are alternately disposed.

For example, the source contact 72 and the drain contact 73 have an X-directional length of 0.75 μm and a Y-directional length of 3.0 μm in size, and the source contact 72 and the drain contact 73 have a substantially rectangular shape, a track shape, or an ellipse in a planar shape. A portion of the semiconductor layer 70a corresponding to the source contact 72 and the drain contact 73 protrudes by about 1 μm in the X direction from a portion of the semiconductor layer 70a extending in the Y direction.

Six gate lines 71g corresponding to one series are connected to the selection signal supply line 121, and a selection signal (selection signal S1 in FIG. 9) is supplied from the data line driving circuit 101. Each of the plurality of image signal lines 111, to which image signals (VID1 to VID6) are supplied, is connected to the source region of the semiconductor layer 70a of the S-TFT 71K via the connection wiring 112 and a plurality (four portions) of source contacts 72. Each of the six data lines 6a corresponding to one series is connected to the drain region of the semiconductor layer 70a of the S-TFT 71K via a plurality of drain contacts 73 (four portions).

The extending direction of the gate line 71g, that is, the width of the channel region in the Y direction is referred to as a channel width W. The disposition interval of the data lines 6a in the X direction orthogonal to the Y direction is referred to as a disposition pitch Px. Since the S-TFT 71K is provided for each data line 6a, the disposition pitch of the S-TFTs 71K is also the Px.

The disposition pitch Px of the S-TFTs 71K in the sample and hold circuit 7K of the example of the related art is, for example, 10 μm. From the viewpoint of stably supplying high frequency image signals (VID1 to VID6) with a high voltage to the data line 6a, the channel width W of the S-TFT 71K is set to be longer than the channel width W of the TFT 30 as a switching element disposed at the pixel P as shown in FIG. 3, and is, for example, 600 μm.

As will be described later in detail, a light shielding layer 75K having a planar shape similar to that of the semiconductor layer 70a is provided under the semiconductor layer 70a of the S-TFT 71K. Therefore, a meandering space Ls is generated between the S-TFTs 71K adjacent in the X direction in a plan view due to the source contact 72 and the drain contact 73 disposed alternately.

Next, referring to FIG. 10, the structure of the sample and hold circuit of the example of the related art will be described. FIG. 10 is a sectional view taken along line X-X of FIG. 9 and crossing two S-TFTs 71K adjacent in the X direction.

As shown in FIG. 10, a light shielding layer 75K is first formed on a light-transmitting base material 10s. In considering that the semiconductor layer 70a of polysilicon is formed at a high temperature thereafter, the light shielding layer 75K includes at least one of high melting point metals such as Ti, Cr, Mo, Ta, and W, and is formed by patterning at a position overlapping the semiconductor layer 70a using a metal simple substance, alloy, metal silicide, polysilicide, and laminate thereof, or conductive polysilicon or the like. In the embodiment, the light shielding layer 75K is formed using tungsten silicide (W—Si), and the film thickness on the base material 10s is, for example, about 200 nm (nanometer).

A first interlayer insulating film 11 is formed to cover the light shielding layer 75K, and a semiconductor layer 70a is formed on the first interlayer insulating film 11. As mentioned above, for example, impurity ions are selectively implanted into the semiconductor layer 70a made of polysilicon to form a source region 70s, a channel region 70c, and a drain region 70d. The film thickness of the semiconductor layer 70a on the first interlayer insulating film 11 is, for example, about 40 nm. The configuration of the semiconductor layer 70a is not limited thereto, and may be, for example, Lightly Doped Drain (LDD) structure having a junction region between the channel region 70c and the source region 70s, and between the channel region 70c and the drain region 70d.

A gate insulating film 12 is formed to cover the semiconductor layer 70a, and a gate line 71g is formed on the gate insulating film 12 at a position overlapping with the channel region 70c. The gate line 71g is formed using conductive polysilicon, for example.

A second interlayer insulating film 13 is formed to cover the gate line 71g. The first interlayer insulating film 11, the gate insulating film 12, and the second interlayer insulating film 13 are formed by depositing silicon oxide or the like, for example, using a CVD method. The film thickness of the first interlayer insulating film 11 is, for example, about 400 nm. The film thickness of the gate insulating film 12 is thinner than the film thickness of the first interlayer insulating film 11, and is, for example, about 50 nm. The film thickness of the second interlayer insulating film 13 is larger than the film thickness of the first interlayer insulating film 11 for the purpose of alleviating irregularities caused by the light shielding layer 75K formed on a base material 10s, the semiconductor layer 70a, and the gate line 71g, and is, for example, about 500 nm.

On the second interlayer insulating film 13, holes penetrating the gate insulating film 12 and the second interlayer insulating film 13 are formed at positions overlapping the source region 70s and the drain region 70d, respectively, using a method such as dry etching or the like. A conductive film covering at least the inside of these holes and covering the surface of the second interlayer insulating film 13 is formed by using a low resistance wiring material such as aluminum or alloy thereof. By patterning this conductive film, the source contact 72 and the connection wiring 112 connected to the source region 70s are formed, and the drain contact 73 and the data line 6a connected to the drain region 70d are formed.

A space Ls in micron unit is generated between the S-TFTs 71K adjacent in the X direction. In the space Ls, as described above, the first interlayer insulating film 11, the gate insulating film 12, and the second interlayer insulating film 13 are present. As compared with the case where the first interlayer insulating film 11, the gate insulating film 12, and the second interlayer insulating film 13 are stacked at a flat portion on the base material 10s, the first interlayer insulating film 11, the gate insulating film 12, and the second interlayer insulating film 13 in the space Ls are in a deformed state in a sectional view so as to cover a gap between the adjacent light shielding layers 75K.

For example, in a case where a heat treatment is performed in the process of forming the sample and hold circuit 7K or the process after forming the sample and hold circuit 7K, a stress may be applied to the space Ls due to a difference in a thermal expansion coefficient between the base material 10s and the structure such as the S-TFT 71K formed on the base material 10s or the like.

As shown in FIG. 9, the space Ls between the S-TFTs 71K adjacent in the X direction is formed meandering so as to weave between the source contact 72 and the drain contact 73 disposed alternately. Therefore, in a case where a stress is applied to the space Ls in micron unit which is subjected to a heat treatment or the like, for example, there is a possibility that cracks are generated in the first interlayer insulating film 11, the gate insulating film 12, and the second interlayer insulating film 13 in which the sectional shape of the space Ls is deformed. In a case where a crack generated in the space Ls grows and reaches the semiconductor layer 70a, or the data line 6a and the connection wiring 112 connected to the semiconductor layer 70a, the S-TFT 71K is damaged and the sample and hold circuit 7K do not operate normally. In a case where the crack reaches the light shielding layer 75K, the light shielding property of the light shielding layer 75K is reduced, so that there is a possibility that the S-TFT 71K causes an optical malfunction. Such a problem is more likely to occur as pixels P are disposed at a high density in the display region E in order to enable high-definition display in the liquid crystal device 100, so that the disposition pitch Px of the data lines 6a, that is, the disposition pitch Px of the sampling transistors (S-TFT) 71K becomes narrower and the width of the meandering space Ls becomes smaller, or a length in the Y direction of the meandering space Ls, that is, the channel width W becomes longer.

The inventors developed a sample and hold (SH) circuit 7 capable of improving the problem in the above example of the related art, even though a region, in which the sample and hold (SH) circuit 7 of the embodiment is provided, is restricted so that the sampling transistors (S-TFT) 71 corresponding to the disposition of the high-definition pixels P are disposed at a narrow pitch. Hereinafter, the sample and hold (SH) circuit 7 of the embodiment will be described with reference to FIGS. 11 to 13. The same components as those of the above-described example of the related art are denoted by the same reference numerals, and the detailed description thereof will be omitted.

Figure 11:
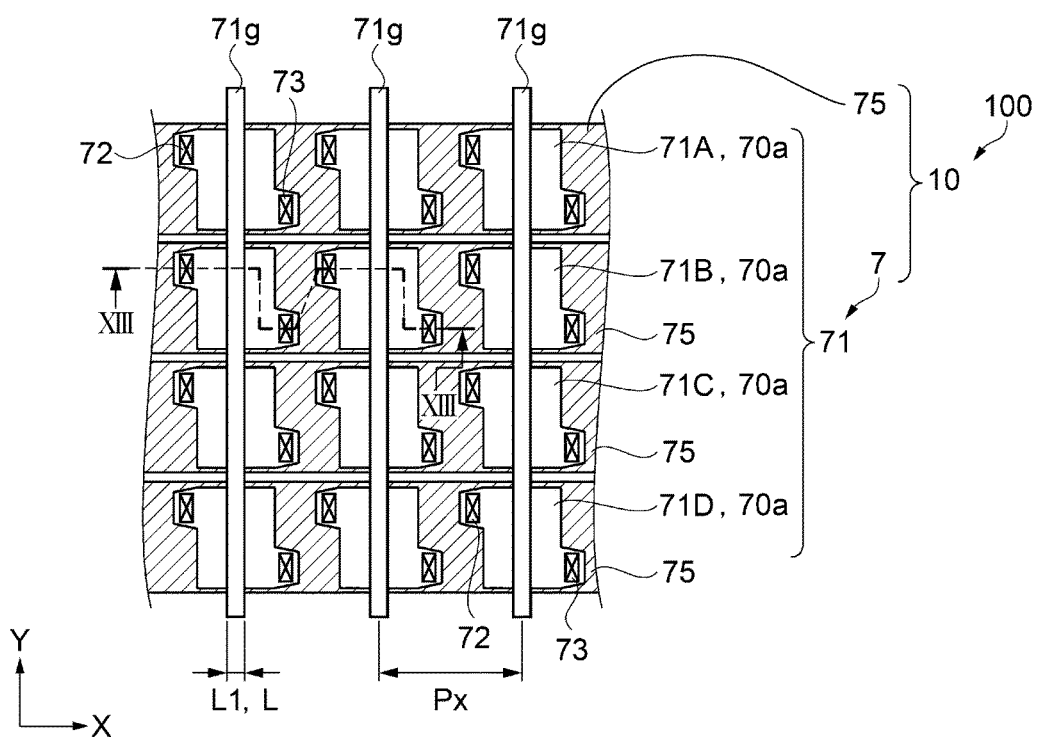
FIG. 11 is a schematic plan view showing a configuration of a sample and hold circuit in a liquid crystal device of a first embodiment.
Figure 12:
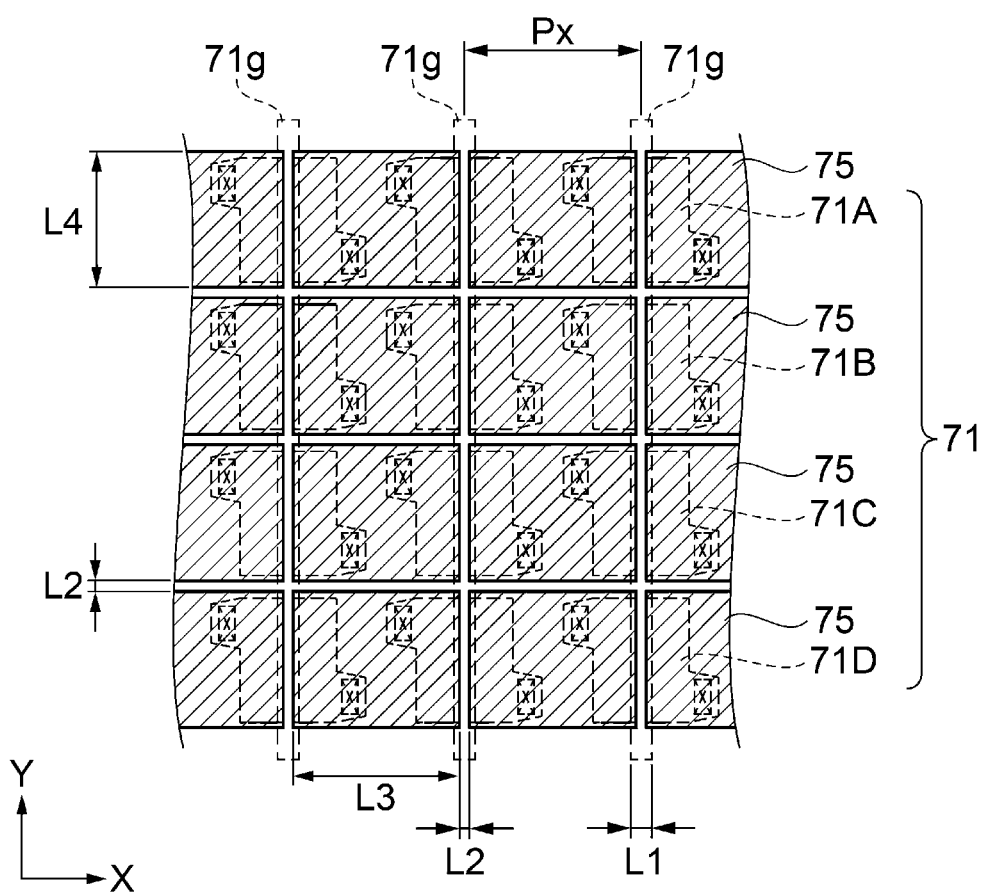
FIG. 12 is a schematic plan view showing the disposition of a light shielding portion in the sample and hold circuit of the first embodiment.
Figure 13:
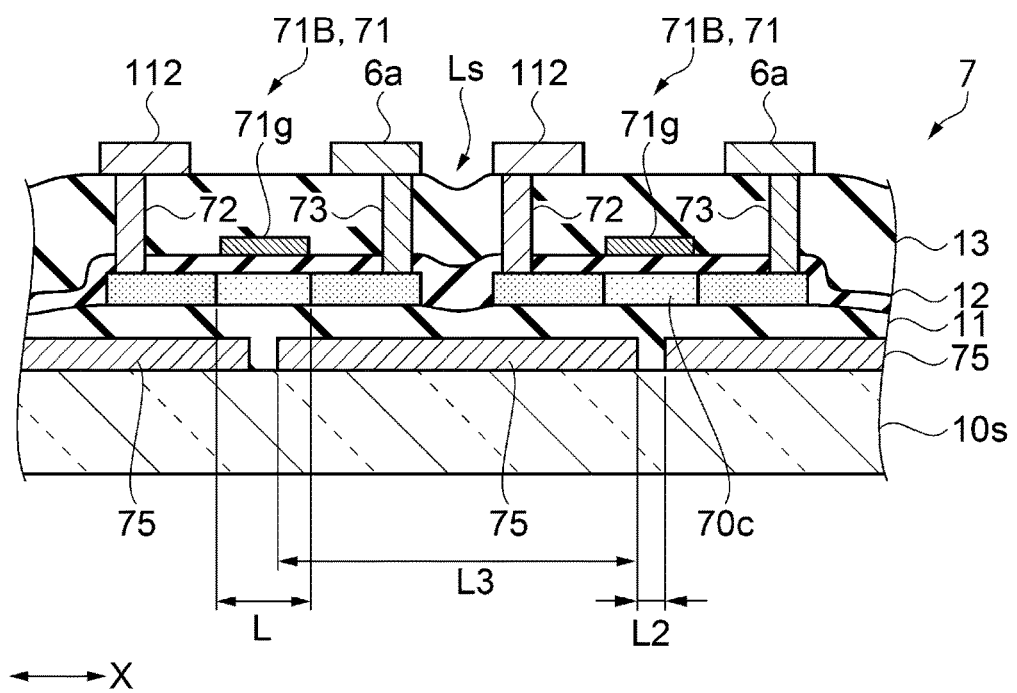
FIG. 13 is a schematic sectional view showing the structure of the sample and hold circuit of the first embodiment, taken along line XIII-XIII of FIG. 11.

FIG. 11 is a schematic plan view showing the configuration of the sample and hold circuit in the liquid crystal device of the first embodiment, FIG. 12 is a schematic plan view showing the disposition of the light shielding portion in the sample and hold circuit of the first embodiment, and FIG. 13 is a schematic sectional view showing the structure of the sample and hold circuit of the first embodiment, taken along the line XIII-XIII in FIG. 11. In FIGS. 11 and 12, sample and hold circuits for one series are not shown, but the number of sampling transistors (S-TFT) 71, gate lines 71g, and light shielding layer 75 necessary for description are shown, and illustration of other related data lines 6a and connection wiring 112 are omitted.

As shown in FIG. 11, in the element substrate 10 of the liquid crystal device 100 of the embodiment, the sample and hold (SH) circuit 7 has a sampling transistor (S-TFT) 71 provided for each data line 6a. The S-TFT 71 of the embodiment is made of a plurality of (in this case, four) transistors 71A, 71B, 71C, and 71D aligned in the Y direction in which a linear gate line 71g extends, and connected in parallel to each other. On the lower layer (a rear surface side in FIG. 11) of each of the transistors 71A, 71B, 71C, and 71D, a light shielding layer 75 which is an example of the first light shielding layer in the invention is provided. The material composition, and the film thickness of the light shielding layer 75 are the same as those of the light shielding layer 75K in the sample and hold circuit 7K of the above-mentioned example of the related art.

The disposition pitch Px in the X direction of the S-TFT 71 made of the plurality of transistors 71A, 71B, 71C, and 71D is the same as that of the above-mentioned example of the related art, and is, for example, 10 μm (micrometer). The width L1 of the gate line 71g in the X direction is, for example, 2 to 3 μm. The channel width of each transistor 71A, 71B, 71C, and 71D is, for example, 150 μm. That is, the plurality of transistors 71A, 71B, 71C, and 71D of the embodiment are formed by dividing the semiconductor layer 70a so that the channel widths thereof are a quarter of the channel width of the S-TFT 71K of the example of the related art. In other words, the total value of the channel widths of the plurality of transistors 71A, 71B, 71C, and 71D is 600 μm which is the same as the channel width W of the S-TFT 71K of the example of the related art.

As shown in FIG. 12, the light shielding layer 75 is divided for each of a plurality of transistors 71A, 71B, 71C, and 71D in the Y direction and is divided in a state of straddling two transistors adjacent in the X direction. The length of the gap L2 of the light shielding layer 75 divided into the X direction and the Y direction is smaller than the width L1 of the gate line 71g in the X direction, and is, for example, about 1 μm. The width L3 of the divided light shielding layer 75 in the X direction is, for example, about 9 μm. Similarly, the width L4 of the divided light shielding layer 75 in the Y direction is substantially the same as or a value slightly larger than the length of the channel width of each of the transistors 71A, 71B, 71C, and 71D, that is 150 μm.

As shown in FIG. 13, the division position of the light shielding layer 75 in the X direction is located below the gate line 71g. The length of the gap L2 of the divided light shielding layer 75 is smaller than the length of the channel region 70c of the transistor 71B (S-TFT 71), that is, the channel length L (or the width L1 of the gate line 71g in the X direction). With such a length of the gap L2, even though light is incident on the gap L2, it is difficult for the S-TFT 71 to generate a light leak current due to the incident light. In other words, the light shielding property of the light shielding layer 75 with respect to the S-TFT 71 may be secured.

Since the first interlayer insulating film 11 in the space Ls between the two transistors 71B (S-TFT 71) adjacent in the X direction covers the light shielding layer 75 that is formed to straddle the two transistors 71B (S-TFT 71), the first interlayer insulating film 11 is in a flat state without a shape in cross-section view being deformed. That is, in the space Ls, the deformation of the first interlayer insulating film 11, the gate insulating film 12, and the second interlayer insulating film 13 in the sectional view is alleviated as compared with the sample and hold circuit 7K of the example of the related art.

The light shielding layer 75 for one series of sample and hold (SH) circuit 7 has a portion that is disposed to straddle two transistors (semiconductor layers 70a) adjacent in the X direction, and another portion that is disposed to straddle one transistor (semiconductor layer 70a) at the end portion of one series.

The disposition of the light shielding layer 75 in which, in the above-described space Ls, deformation of the first interlayer insulating film 11, the gate insulating film 12, and the second interlayer insulating film 13 in the sectional view may be alleviated, is not limited thereto. Hereinafter, the disposition of the light shielding layer 75 of the modification example will be described with reference to FIGS. 14 to 19. Also, in the modification example described below, the same components are denoted by the same reference numerals, and the detailed description thereof will be omitted. In FIGS. 14 to 19, the number of sampling transistors (S-TFT) 71 among one series, which are necessary for description, are shown.

Figure 14:
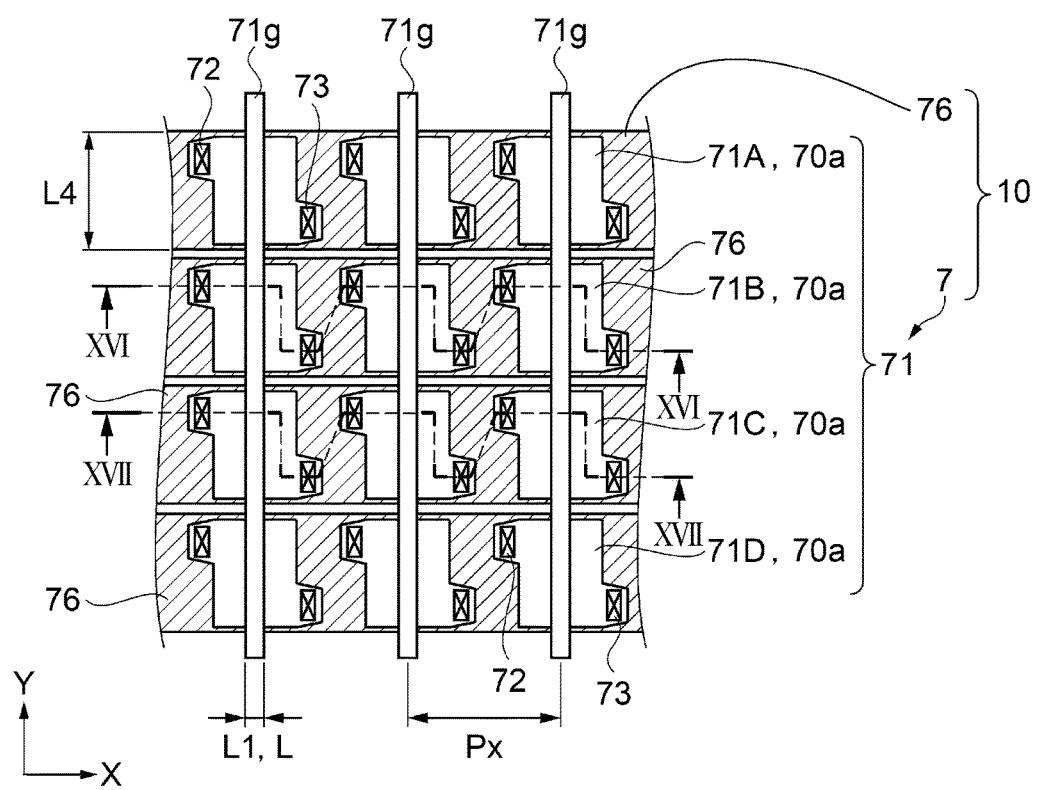
FIG. 14 is a schematic plan view showing a disposition of sampling transistors in the sample and hold circuit of Modification Example 1.
Figure 15:
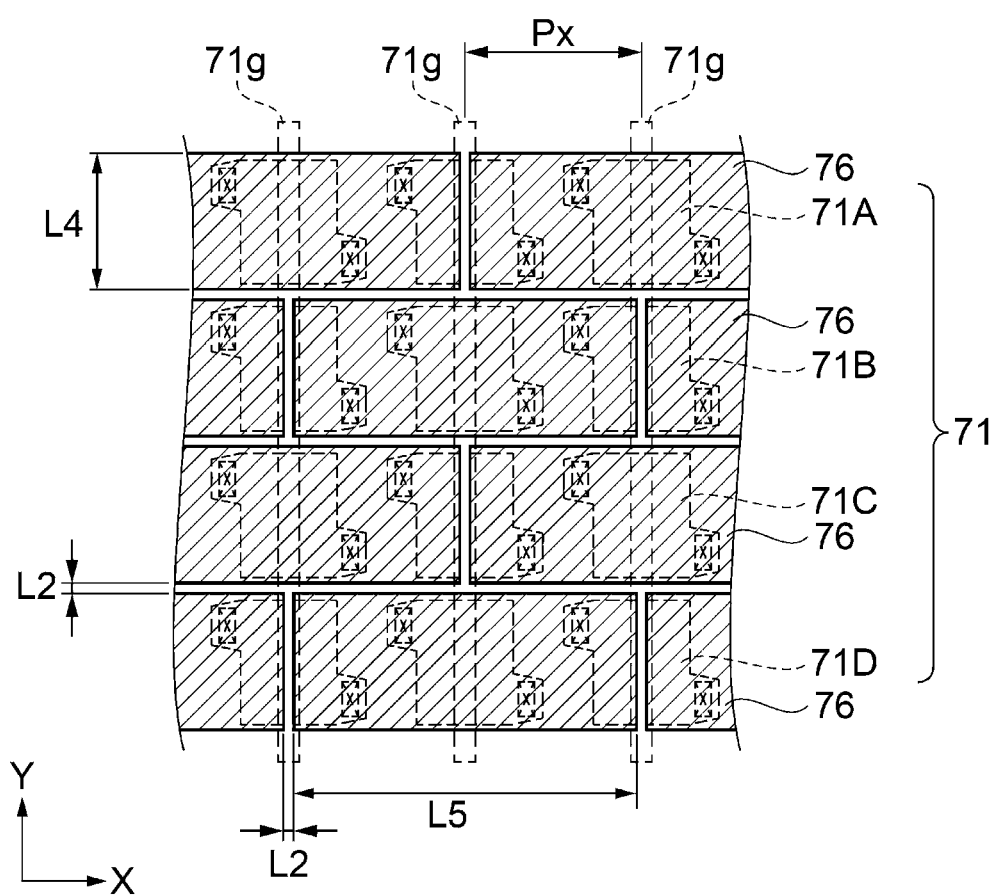
FIG. 15 is a schematic plan view showing a disposition of a light shielding layer in a sample and hold circuit of Modification Example 1.
Figure 16:
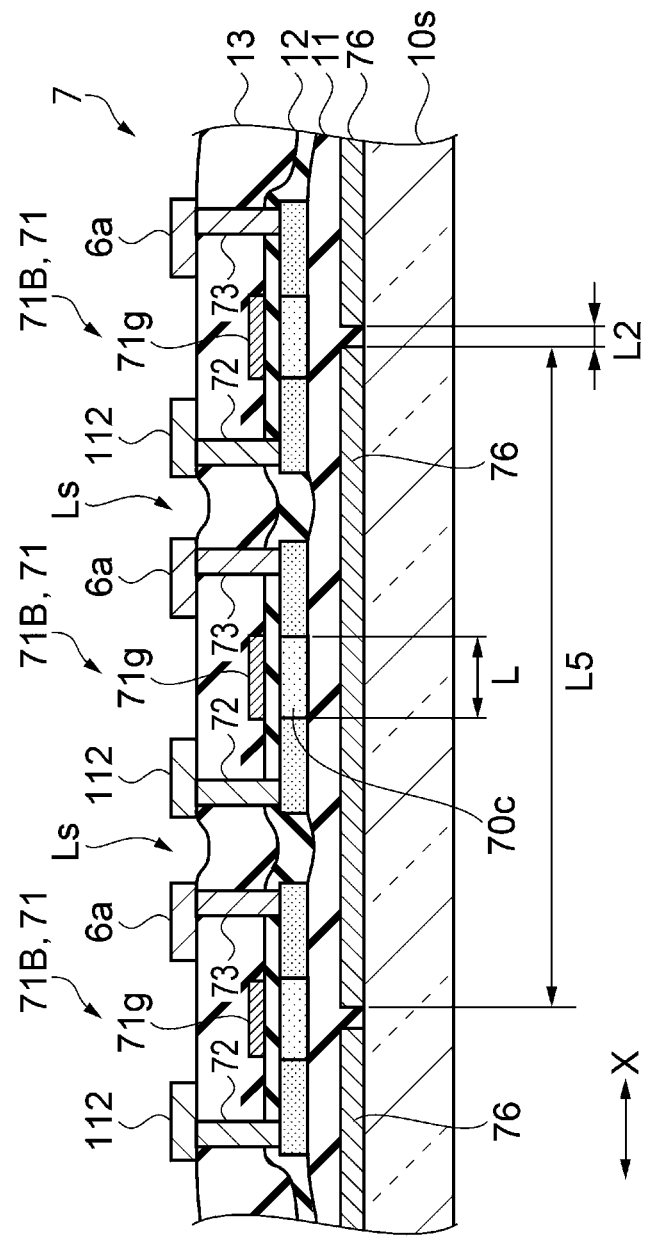
FIG. 16 is a schematic sectional view showing the structure of the sampling transistor of Modification Example 1, taken along line XVI-XVI of FIG. 14.
Figure 17:
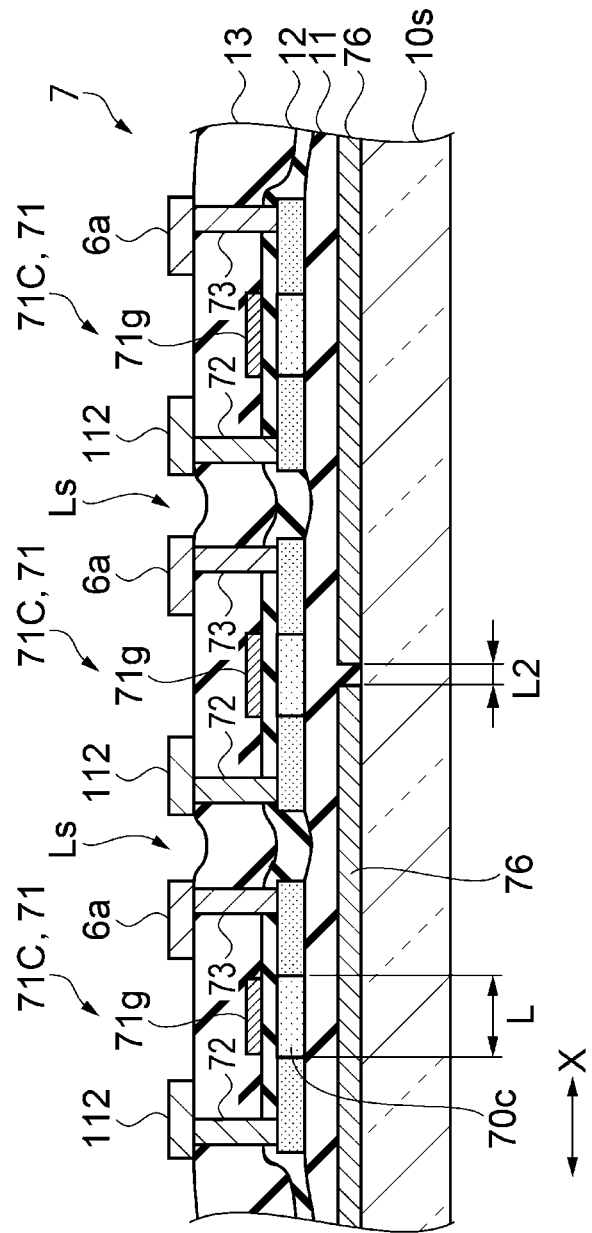
FIG. 17 is a schematic sectional view showing the structure of the sampling transistor of Modification Example 1, taken along line XVII-XVII of FIG. 14.

FIG. 14 is a schematic plan view showing the disposition of the sampling transistors in the sample and hold circuit of Modification Example 1, FIG. 15 is a schematic plan view showing the disposition of light shielding layers in the sample and hold circuit of Modification Example 1, FIG. 16 is a schematic sectional view showing the structure of the sampling transistor of Modification Example 1, taken along the line XVI-XVI of FIG. 14, and FIG. 17 is a schematic sectional view of the sampling transistor of Modification Example 1, taken along the line XVII-XVII of FIG. 14.

Modification Example 1

As shown in FIG. 14, the sample and hold (SH) circuit 7 of Modification Example 1 includes the sampling transistors (S-TFT) 71 made of a plurality of (four) transistors 71A, 71B, 71C, and 71D aligned in the Y direction in which a linear gate line 71g extends, and connected in parallel. Under the layer of the plurality of transistors 71A, 71B, 71C, and 71D, a light shielding layer 76 divided for each of the plurality of transistors 71A, 71B, 71C, and 71D in the Y direction is provided. The channel widths in the plurality of transistors 71A, 71B, 71C, and 71D and the width L4 of the divided light shielding layer 76 in the Y direction are about 150 μm as described above. The SH circuit 7 and the light shielding layer 76 are provided on the element substrate 10.

As shown in FIG. 15, the light shielding layer 76 is divided in a state of straddling three transistors in the X direction. The light shielding layer 76 is divided such that the division position of the light shielding layer 76 in the X direction is shifted for each transistor aligned in the Y direction. That is, the division in the X direction of the light shielding layer 76 of Modification Example 1 as compared with the above-mentioned light shielding layer 75 is not continuous in the Y direction. The division position of the light shielding layer 76 in the X direction overlaps the gate line 71g in a plan view. The width L5 of the divided light shielding layer 76 in the X direction is about 19 μm. The gap L2 of the light shielding layer 76 in the X direction and the Y direction is about 1 μm.

As shown in FIG. 16, in the light shielding layer 76 disposed on the base material 10s, the division position of the light shielding layer 76 disposed under the layer of the transistor 71B exists under the channel regions 70c of the transistors 71B on both sides of three transistors 71B, but the light shielding layer 76 is not divided under the channel region 70c of the transistor 71B located at the center.

As shown in FIG. 17, in the light shielding layer 76 disposed on the base material 10s, the division position of the light shielding layer 76 disposed under the layer of the transistor 71C exists under the channel region 70c of the transistor 71C located at the center of three transistors 71C, but the light shielding layer 76 is not divided under the channel regions 70c of the transistors 71C on both sides.

The light shielding layer 76 for one series of sample and hold circuit 7 of Modification Example 1 has a portion that is disposed to straddle three transistors (semiconductor layers 70a) adjacent in the X direction and another portion that is disposed to straddle one transistor (semiconductor layer 70a) at the end portion of one series.

According to the disposition of the light shielding layer 76 of Modification Example 1, since the division portion of the light shielding layer 76 in the X direction is not continuous in the Y direction, cracks are hardly generated in the first interlayer insulating film 11 covering the division portion. Since the number of divisions of the light shielding layer 76 in the X direction is decreased relative to that of the above-mentioned light shielding layer 75, there is a low probability that cracks in the insulating film covering the gap L2 of the light shielding layer 76 are generated. In addition, the light shielding property of the light shielding layer 76 relative to a plurality of transistors 71A, 71B, 71C, and 71D is improved.

Figure 18:
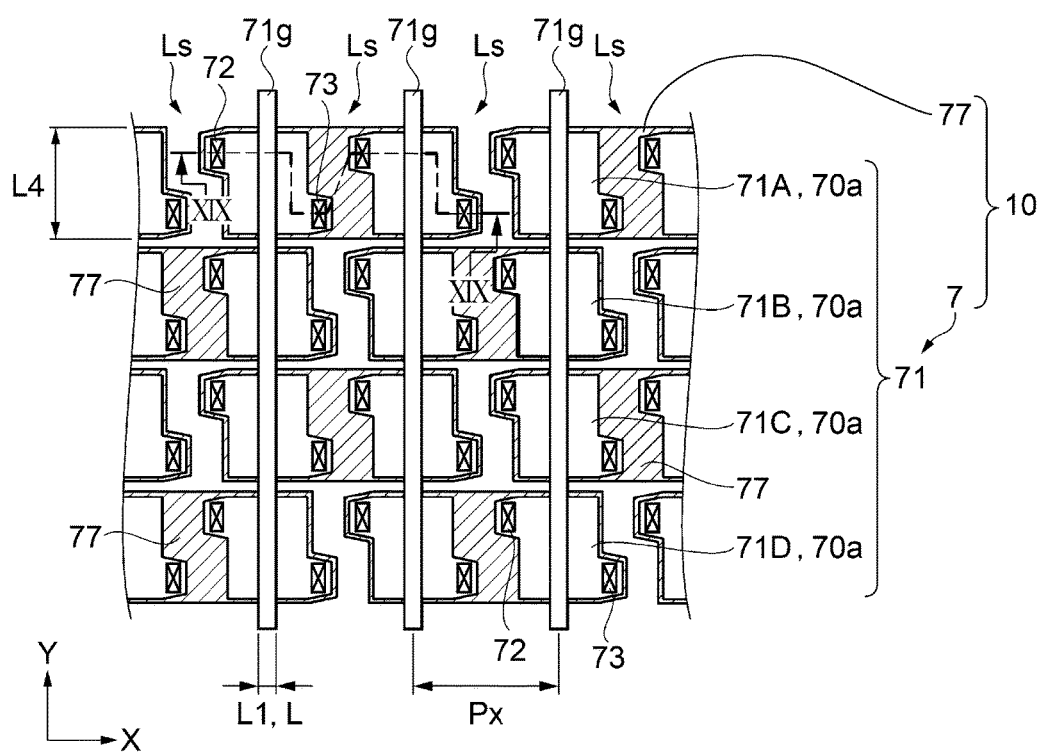
FIG. 18 is a schematic plan view showing a disposition of a sampling transistor and a light shielding layer in a sample and hold circuit of Modification Example 2.
Figure 19:
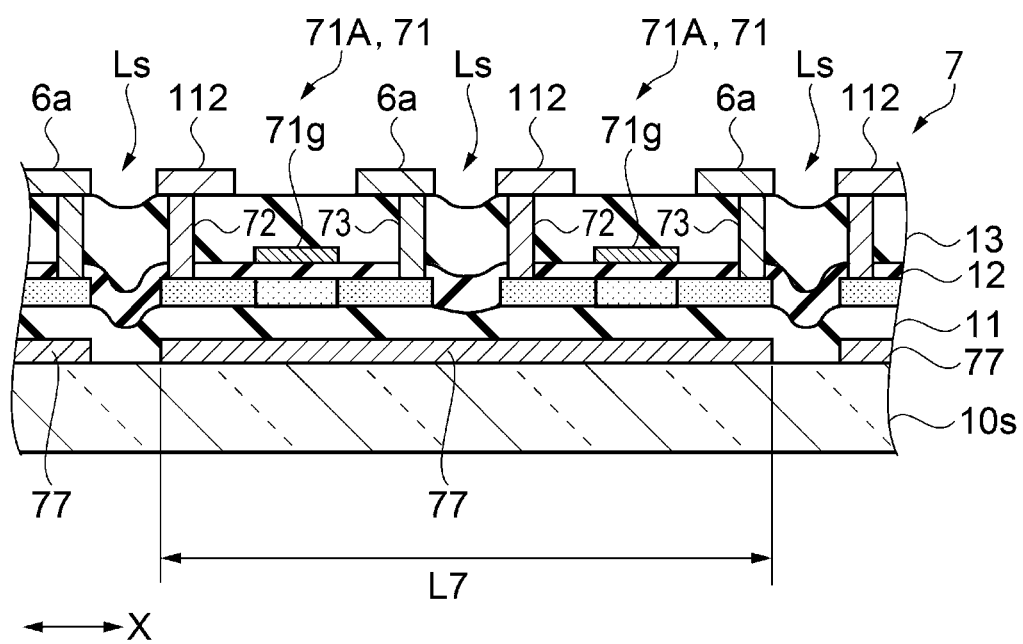
FIG. 19 is a schematic sectional view showing the structure of the sampling transistor of Modification Example 2, taken along line XIX-XIX of FIG. 18.

FIG. 18 is a schematic plan view showing the disposition of the sampling transistor and the light shielding layer in the sample and hold circuit of Modification Example 2, and FIG. 19 is a schematic sectional view showing the structure of the sampling transistor of Modification Example 2, taken along the line XIX-XIX of FIG. 18.

Modification Example 2

As shown in FIG. 18, the sample and hold (SH) circuit 7 of Modification Example 2 includes the sampling transistors (S-TFT) 71 made of a plurality of (four) transistors 71A, 71B, 71C, and 71D aligned in the Y direction in which a linear gate line 71g extends and connected in parallel. Under the layer of a plurality of transistors 71A, 71B, 71C, and 71D, a light shielding layer 77 divided for each of the plurality of transistors 71A, 71B, 71C, and 71D in the Y direction is provided. The channel widths in the plurality of transistors 71A, 71B, 71C and 71D, and the width L4 of the divided light shielding layer 77 in the Y direction are about 150 µm as described above. The SH circuit 7 and the light shielding layer 77 are provided on the element substrate 10.

The light shielding layer 77 is disposed so as to overlap two transistors (the semiconductor layer 70a) adjacent in the X direction, and has portions that protrude in the X direction, corresponding to the source contact 72 and the drain contact 73. That is, in a plan view, the end portion of one side of the light shielding layer 77 in the X direction overlaps the end portion of semiconductor layer 70a of one side of the two semiconductor layers 70a. The end portion of the other side of the light shielding layer 77 in the X direction overlaps the end portion of semiconductor layer 70a of the other side of the two semiconductor layers 70a.

Furthermore, the division position of the light shielding layer 77, which is divided and disposed using two transistors (semiconductor layers 70a) adjacent in the X direction as one unit, is shifted for each of the plurality of transistors 71A, 71B, 71C, and 71D aligned in the Y direction.

Therefore, a space Ls, in which the light shielding layer 77 does not exist, is formed between the light shielding layers 77 divided using two transistors (semiconductor layers 70a) adjacent in the X direction as one unit. On the other hand, the space Ls, in which the light shielding layer 77 does not exist, is formed in a state of being shifted in the X direction, without being continuous in the Y direction.

The light shielding layer 77 for one series of sample and hold circuits 7 of Modification Example 2 has a portion that is disposed using two transistors (semiconductor layers 70a) adjacent in the X direction as one unit, and another portion that is disposed using one transistor (semiconductor layer 70a) as one unit at the end portion of one series.

The channel widths in the plurality of transistors 71A, 71B, 71C and 71D, and the width L4 of the divided light shielding layer 77 in the Y direction are about 150 µm as described above. The disposition pitch Px of the sampling transistor 71 (the plurality of transistors 71A, 71B, 71C, and 71D) adjacent in the X direction is also about 10 µm as described above. The width L1 (that is, the channel length L) of the gate line 71g in the X direction is about 2 to 3 µm.

As shown in FIG. 19, the light shielding layer 77 on the base material 10s is disposed under the layer of the two transistors 71A adjacent in the X direction. The division position of the light shielding layer 77 in the X direction exists between the units using two transistors 71A adjacent in the X direction as one unit. The sectional shape of the first interlayer insulating film 11 on the light shielding layer 77 in the space Ls is flat. Meanwhile, the sectional shape of the first interlayer insulating film 11 of the space Ls corresponding to the gap of the light shielding layer 77 in the X direction is slightly deformed. The width L7 of the light shielding layer 77 of Modification Example 2 in the X direction is about 19 µm.

According to Modification Example 2, the light shielding layer 77 provided between the base material 10s and the plurality of transistors 71A, 71B, 71C, and 71D is divided for each of the plurality of transistors 71A, 71B, 71C, and 71D in the Y direction, and is divided and disposed so as to overlap two transistors adjacent in the X direction. The division position of the light shielding layer 77 in the X direction exists at a position shifted for each of the plurality of transistors 71A, 71B, 71C, and 71D aligned in the Y direction. Therefore, since the meandering space Ls, in which the light shielding layer 77 is not provided, is not continuous in the Y direction, cracks are hardly generated in the insulating film of the space Ls. Since the light shielding layer 77 is not divided under the semiconductor layer 70a and is solidly formed, the light shielding layer 77 may reliably shield light that is incident on the semiconductor layer 70a from the base material 10s, as compared with the light shielding layer 75 and the light shielding layer 76 of Modification Example 1.

Monitor Circuit

Figure 20:
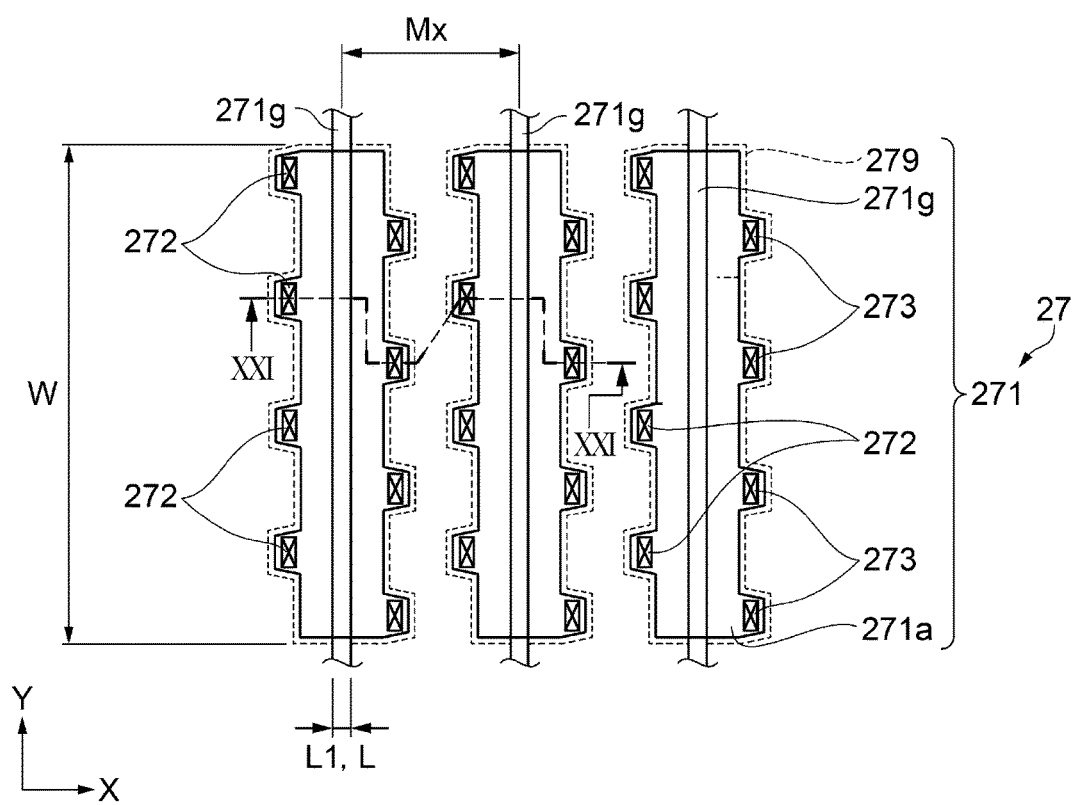
FIG. 20 is a schematic plan view showing a disposition of monitoring transistors in a monitor circuit.
Figure 21:
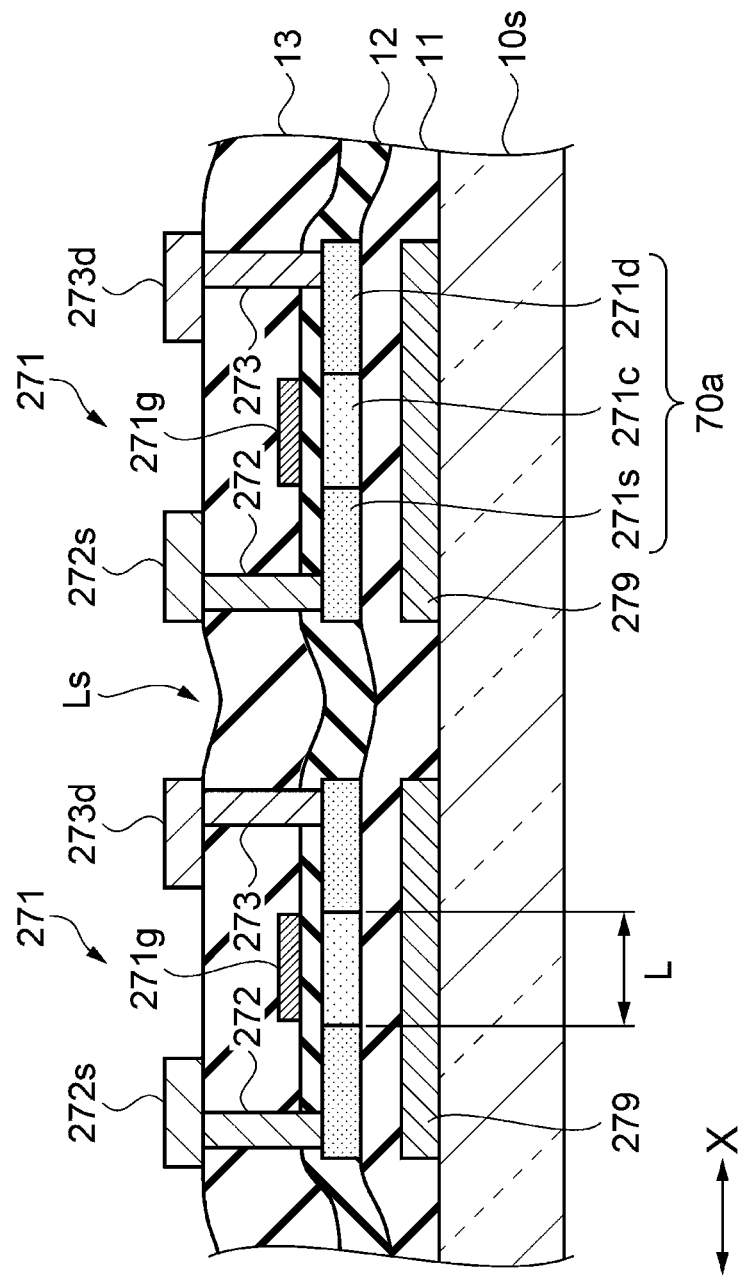
FIG. 21 is a schematic sectional view showing the structure of a monitoring transistor, taken along line XX-XXI-XXI of FIG. 20.

Next, the configuration of the monitoring transistors (M-TFT) 271 and the like in the monitor (MON) circuit 27 will be described with reference to FIGS. 20 and 21. FIG. 20 is a schematic plan view showing the disposition of monitoring transistors in the monitor circuit, and FIG. 21 is a schematic sectional view showing the structure of the monitoring transistor, taken along the line XXI-XXI in FIG. 20. FIG. 20 shows three M-TFTs 271 among six monitoring transistors (M-TFT) 271 in the monitor (MON) circuit 27.

As shown in FIG. 20, the MON circuit 27 has a plurality of M-TFTs 271. The M-TFT 271 has a semiconductor layer 271a provided in an island shape, corresponding to each gate line 271g. The semiconductor layer 271a is made of, for example, polysilicon, and has a source region and a drain region formed by selectively introducing impurity ions, and a channel region between the source region and the drain region. The semiconductor layer 271a is a substantially rectangular shape extending in the Y direction in a plan view. Similarly, a gate line 271g facing the channel region of the semiconductor layer 271a is linearly disposed extending in the Y direction.

In the semiconductor layer 271a, a source contact 272 connected to the source region at the position sandwiching the gate line 271g in the X direction, and a drain contact 273 connected to the drain region are provided. The source contact 272 and the drain contact 273 are alternately disposed at positions shifted from each other in the Y direction. In other words, the semiconductor layer 271a has a plurality of portions (in this case, eight portions) that protrude in the X direction in a plan view, corresponding to the source contact 272 and the drain contact 273 which are alternately disposed.

For example, the source contact 272 and the drain contact 273 have an X-directional length of 0.75 µm and a Y-directional length of 3.0 µm in size, and the source contact 272 and the drain contact 273 have a substantially rectangular shape, a track shape, or an ellipse in a planar shape. A portion of the semiconductor layer 271a corresponding to the source contact 272 and the drain contact 273 protrudes by about 1 µm in the X direction from a portion of the semiconductor layer 271a extending in the Y direction.

Each gate line 271g is connected to an inverter 277. The plurality of source contacts 272 of each M-TFT 271 is connected through the source wiring to the low voltage power supply Vss of the liquid crystal device 100. The plurality of drain contacts 273 of each M-TFT 271 is connected through the drain wiring (see FIG. 5) to the detection terminal 29.

The disposition interval of the gate lines 271g in the X direction orthogonal to the Y direction is referred to as a disposition pitch Mx. Since the M-TFT 271 is provided for each gate line 271g, the disposition pitch of the M-TFT 271 is also the Mx.

The M-TFT 271 is provided for simulating the sampling transistor (S-TFT) 71 of the sample and hold (SH) circuit 7, but the M-TFT 271 is made of one transistor, whereas the S-TFT 71 is made of a plurality of (in this case, four) transistors. From the viewpoint of simulating the S-TFT 71, the channel width (the length of the channel region in the Y direction) of the M-TFT 271 is the same as the channel width W of the S-TFT 71, and is, for example, 600 µm. That is, it may be the that the configuration of the M-TFT 271 is the same as the configuration of the S-TFT 71K of the sample and hold (SH) circuit 7K of the previously described example of the related art.

On the other hand, in the MON circuit 27, the disposition pitch Mx of the M-TFT 271 in the X direction is larger than the disposition pitch Px (for example, 10 µm) of the S-TFT 71K (or S-TFT 71), and is, for example, 15 µm.

A light shielding layer 279 having a planar shape similar to the planar shape of the semiconductor layer 271a is solidly provided under the semiconductor layer 271a of each M-TFT 271. Therefore, a meandering space Ls is generated between the M-TFTs 271 adjacent in the X direction in a plan view, due to the source contact 272 and the drain contact 273 disposed alternately. The light shielding layer 279 is an example of the second light shielding layer according to the invention.

As shown in FIG. 21, a light shielding layer 279 is first formed on a light-transmitting base material 10s. In considering that the semiconductor layer 271a of polysilicon is formed at a high temperature thereafter, the light shielding layer 279 includes at least one of high melting point metals such as Ti, Cr, Mo, Ta, and W, similarly to the light shielding layer 75 of the sample and hold (SH) circuit 7, and is formed by patterning at a position overlapping the semiconductor layer 271a using a metal simple substance, alloy, metal silicide, polysilicide, and laminate thereof, or conductive polysilicon or the like. In the embodiment, the light shielding layer 279 is formed using tungsten silicide (W—Si), and the film thickness on the base material 10s is, for example, about 200 nm.

A first interlayer insulating film 11 is formed to cover the light shielding layer 279, and a semiconductor layer 271a is formed over the first interlayer insulating film 11. For example, impurity ions are selectively implanted into the semiconductor layer 271a made of polysilicon to form a source region 271s, a channel region 271c, and a drain region 271d. The film thickness of the semiconductor layer 271a on the first interlayer insulating film 11 is, for example, about 40 nm. The configuration of the semiconductor layer 271a is preferably the same as that of the semiconductor layer 70a in the S-TFT 71 of the sample and hold (SH) circuit 7. Therefore, in a case where the semiconductor layer 70a of the S-TFT 71 has the LDD structure as mentioned above, it is preferable that the semiconductor layer 271a of the M-TFT 271 also has the LDD structure.

A gate insulating film 12 is formed to cover the semiconductor layer 271a, and a gate line 271g is formed on the gate insulating film 12 at a position overlapping the channel region 271c. The gate line 271g is formed using conductive polysilicon, for example.

A second interlayer insulating film 13 is formed to cover the gate line 271g. The first interlayer insulating film 11, the gate insulating film 12, and the second interlayer insulating film 13 are formed by depositing silicon oxide or the like, for example, using a CVD method. The film thickness of the first interlayer insulating film 11 is, for example, about 400 nm. The film thickness of the gate insulating film 12 is thinner than the film thickness of the first interlayer insulating film 11, and is, for example, about 50 nm. The thickness of the second interlayer insulating film 13 is larger than the film thickness of the first interlayer insulating film 11 for the purpose of alleviating irregularities caused by the light shielding layer 279 formed on the base material 10s, the semiconductor layer 271a, and the gate line 271g, and is, for example, about 500 nm.

On the second interlayer insulating film 13, holes penetrating the gate insulating film 12 and the second interlayer insulating film 13 are formed at positions overlapping the source region 271s and the drain region 271d, respectively, using a method such as dry etching or the like. A conductive film covering at least the inside of these holes and covering the surface of the second interlayer insulating film 13 is formed by using a low resistance wiring material such as aluminum or alloy thereof. By patterning this conductive film, a source contact 272 and a source wiring 272s connected to the source region 271s are formed, and a drain contact 273 and a drain wiring 273d connected to the drain region 271d are formed.

A space Ls in the micron unit is generated between the M-TFTs 271 adjacent in the X direction. In the space Ls, as described above, the first interlayer insulating film 11, the gate insulating film 12, and the second interlayer insulating film 13 are present. The first interlayer insulating film 11, the gate insulating film 12, and the second interlayer insulating film 13 in the space Ls cover the gaps between the adjacent light shielding layers 279, so that the first interlayer insulating film 11, the gate insulating film 12, and the second interlayer insulating film 13 are in a state deformed in a sectional view. However, the disposition pitch Mx of the M-TFT 271 is larger than the disposition pitch Px of the S-TFT 71, so that the degree of deformation in the sectional view is small. In other words, in the manufacturing process of the element substrate 10, even though a stress due to heat or the like is applied to the first interlayer insulating film 11, the gate insulating film 12, and the second interlayer insulating film 13 which fill the space Ls, cracks are hardly generated.

Figure 22:
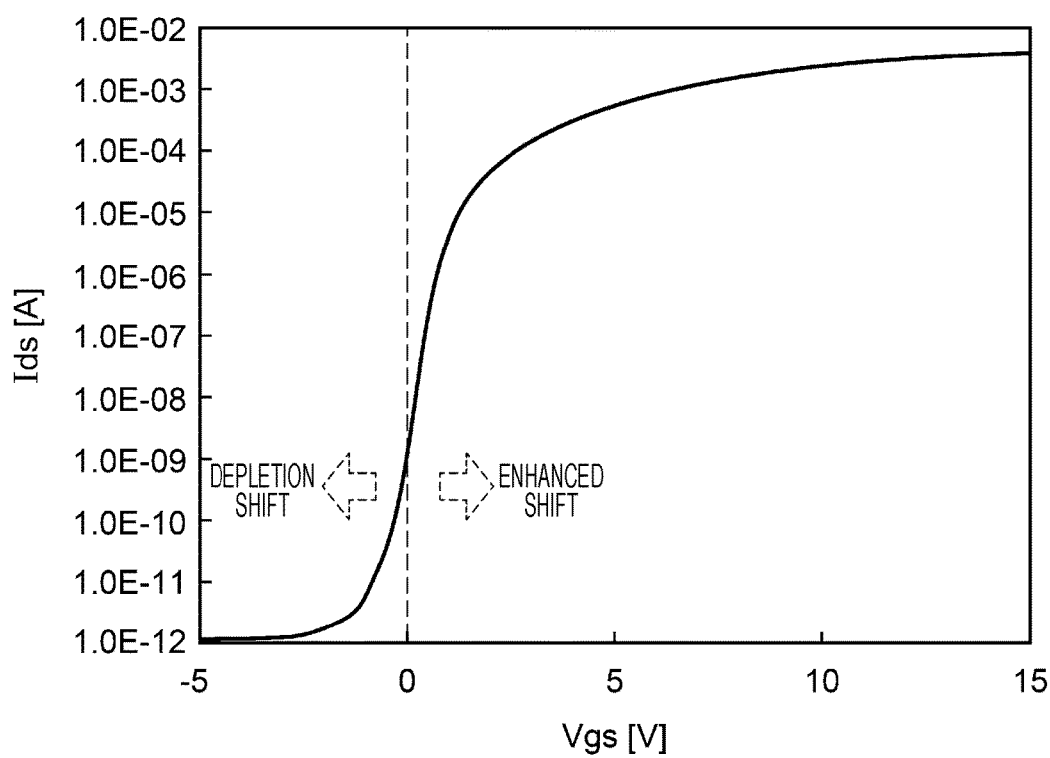
FIG. 22 is a graph showing threshold characteristics (IV characteristics) of a monitoring transistor.

FIG. 22 is a graph showing threshold characteristics (IV characteristics) of the monitoring transistor. As shown in FIG. 22, the threshold characteristics (IV characteristics) of the monitoring transistor (M-TFT) 271 indicates the relationship between a source-gate voltage Vgs (unit V: volts) and a drain-source current Ids (unit A: ampere). As mentioned above, since the source of the M-TFT 271 is connected to the low voltage power supply Vss (in this case, 0V), and the current Ids increases as the current sharply starts to flow in a case where the voltage Vgs becomes 0V or more. Thereafter, in a case where the voltage Vgs becomes about 5V or more, the current Ids also becomes flat. It is known that the IV characteristics of the M-TFT 271 varies as the film thicknesses of the semiconductor layer 271a and the gate insulating film 12 covering the semiconductor layer 271a in manufacturing the M-TFT 271 vary. In particular, since the film thickness of the gate insulating film 12 covering the end portion of the channel region 271c of the semiconductor layer 271a is easy to be thinner than the other portions, in the IV characteristics, the threshold voltage tends to be smaller than 0V (in this case, it is at around 0V), that is, is easy to be depletion-shifted.

As mentioned above, the MON circuit 27 is required to accurately generate the detection signal MON. Therefore, the M-TFT 271 of the MON circuit 27 is required to have a configuration simulating the S-TFT 71 of the SH circuit 7, but in a case where the M-TFT 271 is composed of a plurality of transistors similar to the S-TFT 71, the number of end portions of the channel region 271c in the semiconductor layer 271a increases, so that the IV characteristics are more likely to be depletion-shifted. The M-TFT 271 according to the embodiment is composed of one transistor, has the channel width substantially equal to the channel width W of the S-TFT 71 and have the shapes of the source contact 272 and the drain contact 273 in the semiconductor layer 271a similar to the configurations of the semiconductor layer 70a of S-TFT 71 so that the M-TFT 271 simulates the S-TFT 71.

The disposition pitch Px of the S-TFT 71 needs to be the same as the disposition pitch of the data lines 6a, and as the disposition pitch of the pixels P becomes smaller, the disposition pitch Px of the S-TFTs 71 also becomes smaller. Meanwhile, the disposition pitch Mx of the M-TFTs 271 need not be the same as the disposition pitch Px of the S-TFTs 71. Therefore, by making the size of the meandering space Ls between the M-TFTs 271 in the X direction larger than that of the S-TFT 71, cracks due to a stress are hardly generated in the first interlayer insulating film 11, the gate insulating film 12, and the second interlayer insulating film 13 filling the space Ls.

According to the configuration of the driving circuit 120 of the liquid crystal device 100 of the first embodiment, the following effects may be obtained.

(1) Sampling transistor (S-TFT) 71 is made of a plurality of transistors 71A, 71B, 71C, and 71D aligned in the Y direction (channel width direction) and electrically connected in parallel. The light shielding layer 75 disposed under the layer of the S-TFT 71 is divided for each of a plurality of transistors 71A, 71B, 71C, and 71D in the Y direction (channel width direction). Therefore, the meandering spaces Ls between the S-TFTs 71 adjacent in the X direction do not be continuously connected in the Y direction, but is divided for each of the plurality of transistors 71A, 71B, 71C, and 71D. Therefore, even though a stress is applied to the first interlayer insulating film 11, the gate insulating film 12, and the second interlayer insulating film 13 which fill the meandering space Ls due to, for example, heat treatment or the like in the manufacturing process, cracks are hardly generated. Thus, the problem that the sample and hold (SH) circuit 7 is damaged due to the cracks generated in the insulating film of the space Ls is reduced. On the other hand, in the monitor (MON) circuit 27 configured to electrically simulate the sample and hold (SH) circuit 7, the monitoring transistors (M-TFT) 271 is composed of one transistor. Therefore, as compared with the case where the M-TFT 271 is composed of a plurality of transistors connected in parallel similar to the S-TFT 71, it is possible to suppress the depletion-shift of threshold characteristics (IV characteristics). Even though since the disposition pitch Mx of the M-TFTs 271 in the X direction is larger than the disposition pitch Px of the S-TFTs 71, the light shielding layer 279 is solidly disposed under the layer of the M-TFT 271, the cracks may be hardly generated in the insulating film filling the meandering space Ls between the M-TFTs 271 adjacent in the X direction. That is, the SH circuit 7 and the MON circuit 27 simulating the SH circuit 7 have the driver circuit 120 which applies the image signals VID to the data lines 6a at an appropriate timing to obtain a stable operation, and it is possible to provide the liquid crystal device 100 having high reliability in which transistors thereof is hardly damaged due to the cracks of the insulating film.

(2) Since in the S-TFT 71 made of the plurality of transistors 71A, 71B, 71C, and 71D connected in parallel and the M-TFT 271 made of one transistor, the channel width W and the width of the gate line (that is, the channel length) are the same and the configurations of the plurality of source contacts and the plurality of drain contacts are also the same, the accuracy of the detection signal MON obtained from the MON circuit 27 is increased, and the amount of the delay of the selection signal may be appropriately fed back via the timing generator 200 to the bidirectional shift register 160 of the data line driving circuit 101.

(3) In the S-TFT 71 and the M-TFT 271, the plurality of source contacts and the plurality of drain contacts are disposed so as to be shifted in the extending direction (Y direction) of the gate line. Therefore, the S-TFT 71 may be disposed at a narrow pitch in the X direction orthogonal to the Y direction. The disposition pitch Mx of the M-TFTs 271 in the X direction needs to be larger than the disposition pitch Px of the S-TFTs 71, but the M-TFT 271 may be disposed at a narrow pitch, as compared with the case where a plurality of source contacts and a plurality of drain contacts are not shifted in the Y direction, so that the region in which the MON circuit 27 is provided may be substantially reduced. That is, even though the SH circuit 7 and the MON circuit 27 are provided, it is possible to realize the liquid crystal device 100 which is smaller than that of the related art.

Second Embodiment

Figure 23:
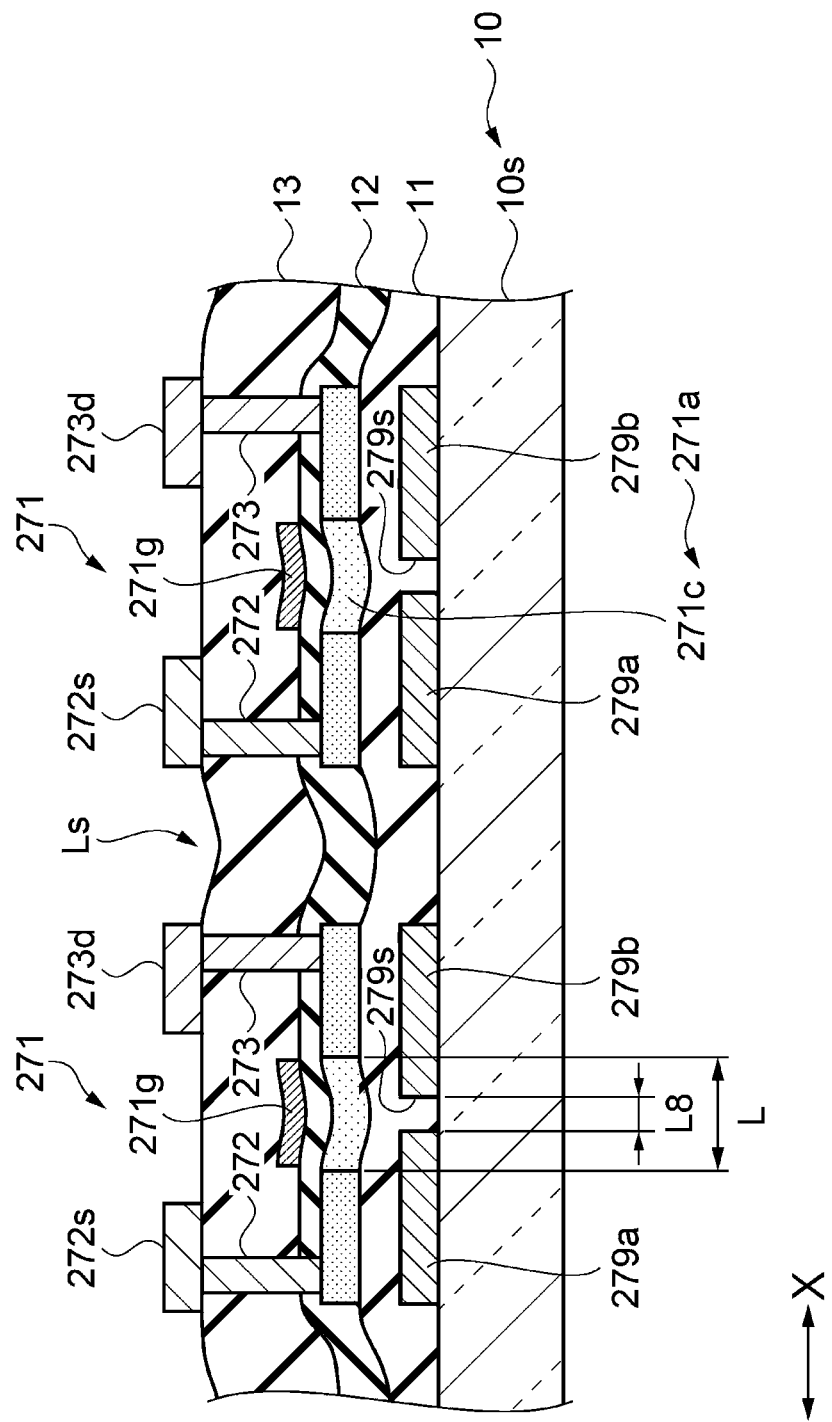
FIG. 23 is a schematic sectional view showing a configuration and structure of a monitoring transistor in a monitor circuit of a liquid crystal device according to a second embodiment.

Next, the electro-optical device of the second embodiment will be described with reference to FIG. 23 by taking a liquid crystal device as an example similar to the first embodiment. FIG. 23 is a schematic sectional view showing the configuration and structure of the monitoring transistor in the monitor circuit of the liquid crystal device of the second embodiment.

The liquid crystal device of the second embodiment basically has the same mechanical and electrical configuration as the liquid crystal device 100 of the first embodiment, and the shapes of the light shielding layer 279 in the MON circuit 27 are made different to each other. Therefore, the same components as those of the liquid crystal device 100 of the first embodiment are denoted by the same reference numerals, and the detailed description thereof will be omitted. FIG. 23 corresponds to FIG. 21 of the first embodiment, and shows the configuration and structure of the monitoring transistor 271, taken along the line XXI-XXI in FIG. 20.

As shown in FIG. 23, a monitoring transistor (M-TFT) 271 is disposed on the base material 10s of the element substrate 10 with a predetermined interval in the X direction. Under the semiconductor layer 271a of the M-TFT 271, a light shielding layer 279a and a light shielding layer 279b which are divided in the X direction (the direction orthogonal to the Y direction which is the channel width direction) are provided with the first interlayer insulating film 11 interposed therebetween. Since the configuration such as a material, and a layer thickness of the two light shielding layers 279a and 279b, is the same as that of the above-mentioned light shielding layer 279, the two light shielding layers 279a and 279b are also examples of the second light shielding layer of the invention.

The gap 279s of the two light shielding layers 279a and 279b in the X direction is located at a position overlapping the channel region 271c of the semiconductor layer 271a. The X-directional length L8 of the gap 279s is shorter than the X-directional length L of the channel region 271c, that is, the channel length L of the M-TFT 271. Specifically, the channel length L of the M-TFT 271 is, for example, 2 to 3 μm, and the length L8 of the gap 279s of the two light shielding layers 279a and 279b in the X direction is, for example, 1 μm. By making the length L8 of the gap 279s smaller than the channel length L, even though the light is incident on the gap 279s, the occurrence of light leakage current in the M-TFT 271 may be suppressed.

The first interlayer insulating film 11 is formed so as to cover the gap 279s, and the semiconductor layer 271a is formed on the first interlayer insulating film 11. Therefore, since the surface of the first interlayer insulating film 11 filling the gap 279s is distorted, the channel region 271c on the distorted surface is also distorted and formed. As a result, the channel region 271c and the gate line 271g opposed thereto are also distorted as compared with the case where the semiconductor layer 271a is formed on the flat first interlayer insulating film 11, so that the channel length L of the M-TFT 271 substantially becomes longer.

In a case where the channel length L of the M-TFT 271 becomes longer, the threshold characteristics (IV characteristics) of the M-TFT 271 shown in FIG. 22 is shifted to a point where the threshold voltage (in this case, it is at around 0V) is larger than 0V, that is, enhanced-shifted.

Figure 24:
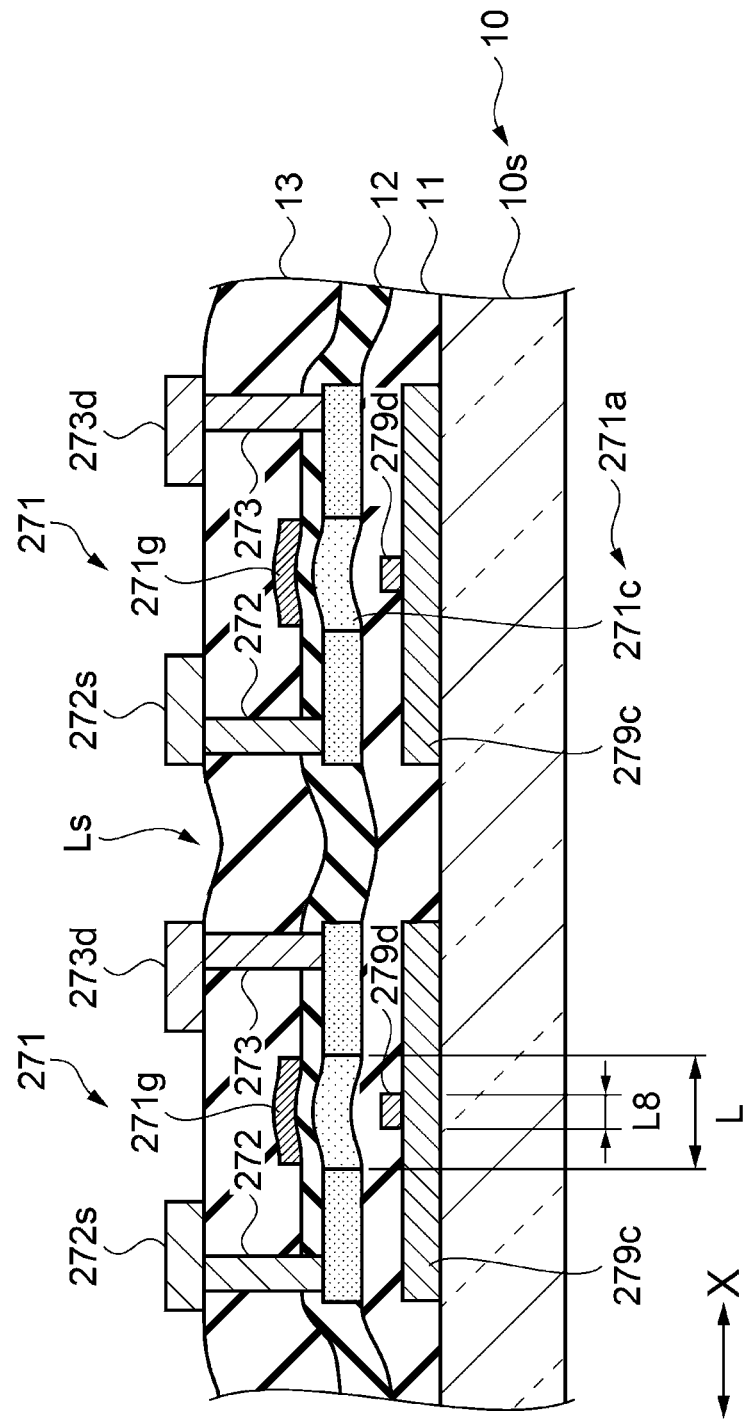
FIG. 24 is a schematic sectional view showing the structure of a monitoring transistor of Modification Example 3.

In this manner, the method of substantially increasing the channel length L of the M-TFT 271 is not limited to the method of dividing the light shielding layer 279 disposed under the layer of the M-TFT 271 in the X direction. FIG. 24 is a schematic sectional view showing the structure of a monitoring transistor of Modification Example 3. FIG. 24 also shows a cross-section taken along the line XXI-XXI of FIG. 20, similarly to FIG. 23.

Modification Example 3

As shown in FIG. 24, in Modification Example 3, under the layer of the M-TFT 271 on the base material 10s, there is disposed a light shielding layer 279c having convex portions 279d protruding toward the channel region 271c side of the semiconductor layer 271a, that is, toward the channel of the M-TFT 271. The channel length 271c of the semiconductor layer 271a and the gate line 271g of the semiconductor layer 271a overlapping the portion of the first interlayer insulating film 11 covering the convex portion 279d are also distorted convexly so that the channel length L of the M-TFT 271 is substantially increased. The length L8 of the convex portion 279d in the X direction (the direction orthogonal to the Y direction which is the channel width direction) is shorter than the channel length L. The height of the convex portion 279d protruding from the light shielding layer 279c is the same as the layer thickness (film thickness) in the other portion of the light shielding layer 279c, and is about 200 nm. Therefore, the convex portion 279d does not necessarily have to be located on the light shielding layer 279c, and may be positioned directly under the light shielding layer 279c. The convex portion 279d is not limited to be composed of the same material as the light shielding layer 279c, and may be composed of different materials. The light shielding layer 279c having the convex portion 279d is also an example of the second light shielding layer according to the invention.

According to the configuration of the monitoring transistors (M-TFT) 271 in the MON circuit 27 of the second embodiment, the channel length L of the M-TFT 271 is substantially increased by disposing two light shielding layers 279a and 279b having a gap 279s or the light shielding layer 279c having the convex portions 279d under the layer of the channel region 271c in the semiconductor layer 271a of M-TFT 271. Therefore, the threshold characteristics (IV characteristics) of the M-TFT 271 are enhanced. Since the threshold characteristics (IV characteristics) of the M-TFT 271 are easy to be depletion-shifted due to variations in the film thickness of the semiconductor layer 271a and the gate insulating film 12 in the manufacturing process, the depletion-shift is corrected by adopting an enhanced-shift structure so that the desired threshold characteristics (IV characteristics) may be realized.

Third Embodiment

Electronic Apparatus

Figure 25:
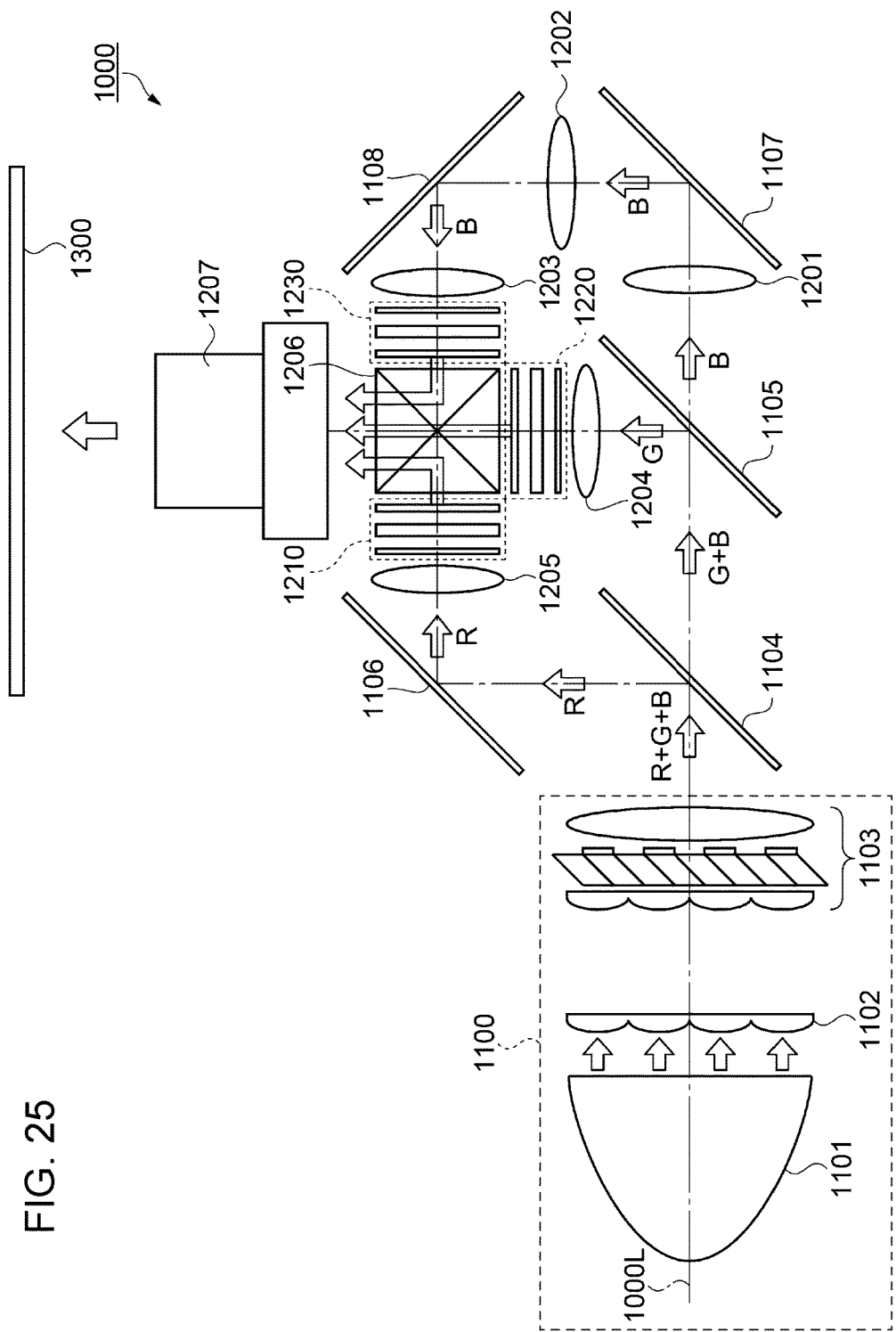
FIG. 25 is a schematic diagram showing a configuration of a projection type display device as an electronic apparatus according to a third embodiment.

With reference to FIG. 25, a projection type display device will be described as an example of an electronic apparatus of a third embodiment to which the liquid crystal device of the above embodiment may be applied. FIG. 25 is a schematic diagram showing a configuration of a projection type display device as an electronic apparatus according to the third embodiment.

As shown in FIG. 25, a projection type display device 1000 as an electronic apparatus according to the embodiment includes a polarized light illuminator 1100 disposed along the system optical axis 1000L, two dichroic mirrors 1104 and 1105 as a light separation element, three reflection mirrors 1106, 1107, and 1108, five relay lenses 1201, 1202, 1203, 1204, and 1205, transmissive liquid crystal light valves 1210, 1220, and 1230 as three light modulating units, a cross dichroic prism 1206 as a light combining element, and a projection lens 1207.

The polarized light illuminator 1100 is schematically configured to have a lamp unit 1101 as a light source made of a white light source such as an extra-high pressure mercury lamp and a halogen lamp, an integrator lens 1102, and a polarization conversion element 1103.

The dichroic mirror 1104 reflects red light (R) out of the polarization flux emitted from the polarized light illuminator 1100, and transmits green light (G) and blue light (B). The other dichroic mirror 1105 reflects the green light (G) transmitted through the dichroic mirror 1104 and transmits the blue light (B).

The red light (R) reflected by the dichroic mirror 1104 is reflected by the reflection mirror 1106 and then is incident on the liquid crystal light valve 1210 through the relay lens 1205.

The green light (G) reflected by the dichroic mirror 1105 is incident on the liquid crystal light valve 1220 through the relay lens 1204.

The blue light (B) transmitted through the dichroic mirror 1105 is incident on the liquid crystal light valve 1230 through a light guiding system made of three relay lenses 1201, 1202, and 1203 and two reflection mirrors 1107 and 1108.

The liquid crystal light valves 1210, 1220, and 1230 are disposed respectively, opposite to the incident surface of each color light of the cross dichroic prism 1206. The color lights incident on the liquid crystal light valves 1210, 1220, and 1230 are modulated based on the video information (display data) and are emitted toward the cross dichroic prism 1206. In this prism, four right angle prisms are bonded, and a dielectric multilayer film that reflects red light and a dielectric multilayer film that reflects blue light are formed in a cross shape on the inner surface of the prism. Three color lights are synthesized by these dielectric multilayer films, and light representing a color image is synthesized. The synthesized light is projected on the screen 1300 by the projection lens 1207 which is a projection optical system, and the image is enlarged and displayed.

The liquid crystal light valve 1210 is one to which the liquid crystal device 100 of the first embodiment having the above-described driving circuit 120 is applied. A pair of polarizing elements disposed in crossed Nicols on the incident side and the emission side of the color light of the liquid crystal panel 110 are disposed with a gap therebetween. The other liquid crystal light valves 1220 and 1230 are also similar.

According to the projection type display device 1000, since the liquid crystal device 100 is used as the liquid crystal light valves 1210, 1220, and 1230, it is possible to obtain a stable driving state in display and provide a projection type display device 1000 having high reliability.

In the embodiment, the white light (polarization flux) emitted from the polarized light illuminator 1100 is split into the respective color lights by the dichroic mirror and incident on the liquid crystal light valves 1210, 1220, and 1230, but is limited thereto. For example, a solid-state light source such as a laser light source or LED capable of obtaining the light emission of each color may be used.

The invention is not limited to the above-described embodiments, but may be appropriately changed within a scope not contrary to the substance or idea of the invention which may be read from the claims and the entire specification, and an electro-optical device involving such a change, or an electro-electronic apparatus to which the electro-optical device is applied are also included in the technical scope of the invention. Various modification examples other than the above embodiment are conceivable. Hereinafter, modification examples will be described.

Modification Example 4

The number of the plurality of transistors constituting the sampling transistor (S-TFT) 71 of the sample and hold (SH) circuit 7 is not limited to four. In consideration of the channel width W (for example, 600 µm) of the S-TFT 71, the number of the plurality of transistors may be four or more, for example, twelve. Accordingly, the channel width of one transistor is 50 µm, and the Y-directional length of the space Ls between the S-TFTs 71 adjacent in the X direction becomes shorter. Therefore, it is possible to substantially increase the withstand voltage of the S-TFT 71 by further suppressing the occurrence of cracks in the insulating film filling the space Ls and increasing the number of transistors.

Modification Example 5

In the monitor (MON) circuit 27 of the above embodiment, a plurality of source contacts and a plurality of drain contacts are provided at positions shifted from each other in the Y direction with the gate line interposed therebetween in both transistors such that a monitoring transistor (M-TFT) 271 has the same configuration as that of a sampling transistor (S-TFT) 71 in order to simulate the sample and hold (SH) circuit 7, but the invention is not limited thereto. Since it is unnecessary to make the disposition pitch Mx of the M-TFT 271 in the X direction be the same as the disposition pitch Px of the S-TFT 71, the plurality of source contacts 272 and the plurality of drain contacts 273 may be disposed to face each other with the gate line 271g interposed therebetween, in a case where a disposition pitch Mx is expanded to the degree that the occurrence of cracks in the insulating film filling in the space Ls between the M-TFTs 271 adjacent in the X direction may be suppressed. In other words, the semiconductor layer 271a may have no portion protruding in the X direction corresponding to the plurality of source contacts 272 and the plurality of drain contacts 273.

Modification Example 6

Electronic apparatus, to which the liquid crystal device 100 of the above embodiment may be applied, are not limited to the projection type display device 1000 of the above third embodiment. For example, by adopting a configuration in which a color filter having a colored layer in a pixel is provided as a liquid crystal device, the liquid crystal device is preferably used for the display portion of information terminal apparatus such as a projection type head up display (HUD), a direct view type head mounted display (HMD), an electronic book, a personal computer, a digital still camera, a liquid crystal television, a view finder type or a monitor direct view type video recorder, a car navigation system, an electronic notebook, a POS, or the like.

Modification Example 7

The liquid crystal device 100, to which the driving circuit 120 of the above embodiment is applied, is not limited to a transmission type. The driving circuit 120 may be also applied to a reflection type liquid crystal device. The electro-optical device, to which the driving circuit 120 of the above embodiment is applied, is not limited to a liquid crystal device, and may also be applied to an organic EL device including an organic EL element which is a light-emitting element in a pixel P.

This application claims priority to Japan Patent Application No. 2017-123992 filed Jun. 26, 2017, the entire disclosures of which are hereby incorporated by reference in their entireties.

What is claimed is:
1. An electro-optical device comprising:
a pixel electrode and a switching element provided for each pixel;
a data line connected to the switching element;
a sampling transistor having a gate that is supplied with a selection signal, a source that is supplied with an image signal, and a drain that is connected to the data line;
a monitoring transistor having a gate that is supplied with an input signal, a source that is supplied with a low voltage power supply, and a drain that sends a delay signal indicating a delay amount of the selection signal;
the sampling transistor and the monitoring transistor being provided on a base material;
a first light shielding layer provided between the base material and the sampling transistor, the first light shielding layer being divided in a channel width direction of the sampling transistor; and
a second light shielding layer provided between the base material and the monitoring transistor, the second light shielding layer being not divided in a channel width direction of the monitoring transistor, the second light shielding layer being divided in a direction orthogonal to the channel width direction of the monitoring transistor so as to have a gap at a position overlapping the channel of the monitoring transistor, wherein:
in a semiconductor configuration of the electro-optical device, the sampling transistor includes a plurality of transistors connected in parallel to each other along the data line, and the monitoring transistor consists of one transistor along the data line.
2. The electro-optical device according to claim 1, wherein the first light shielding layer is divided in the channel width direction of the sampling transistor for each of the plurality of transistors constituting the sampling transistor.

3. The electro-optical device according to claim 1, wherein a length of the gap in the direction orthogonal to the channel width direction of the monitoring transistor is shorter than a channel length of the monitoring transistor.

4. The electro-optical device according to claim 1, wherein the second light shielding layer has a convex portion protruding toward the channel of the monitoring transistor at the position overlapping the channel of the monitoring transistor.

5. The electro-optical device according to claim 4, wherein a length of the convex portion in the direction orthogonal to the channel width direction of the monitoring transistor is shorter than a channel length of the monitoring transistor.

6. The electro-optical device according to claim 1, wherein a channel width of the sampling transistor and a channel width of the monitoring transistor are the same length.

7. The electro-optical device according to claim 1, wherein:
   each of the sampling transistor and the monitoring transistor has a plurality of source contacts and a plurality of drain contacts disposed with a linear gate line serving as a gate electrode interposed therebetween; and
   the plurality of source contacts and the plurality of drain contacts are disposed so as to be shifted in an extending direction of the gate line.

8. An electronic apparatus comprising the electro-optical device according to claim 1.

9. An electro-optical device comprising:
   a pixel electrode and a switching element provided for each pixel;
   a data line connected to the switching element;
   a sampling transistor having a gate that is supplied with a selection signal, a source that is supplied with an image signal, and a drain that is connected to the data line;
   a monitoring transistor having a gate that is supplied with an input signal, a source that is supplied with a low voltage power supply, and a drain that sends a delay signal indicating a delay amount of the selection signal;
   the sampling transistor and the monitoring transistor being provided on a base material;
   a first light shielding layer provided between the base material and the sampling transistor, the first light shielding layer being divided in a channel width direction of the sampling transistor; and
   a second light shielding layer provided between the base material and the monitoring transistor, the second light shielding layer being not divided in a channel width direction of the monitoring transistor, the second light shielding layer being divided in a direction orthogonal to the channel width direction of the monitoring transistor so as to have a gap at a position overlapping the channel of the monitoring transistor, wherein:
   a first number of transistors including the sampling transistor is greater than a second number of transistors including the monitoring transistor.

* * * * *